(12) United States Patent
Lee et al.

(10) Patent No.: US 12,538,840 B2
(45) Date of Patent: Jan. 27, 2026

(54) SEMICONDUCTOR DEVICE AND METHOD OF FORMING MODULE-IN-PACKAGE STRUCTURE USING REDISTRIBUTION LAYER

(71) Applicant: STATS ChipPAC Pte. Ltd., Singapore (SG)

(72) Inventors: GunHyuck Lee, Gyeonggi-do (KR); Yujeong Jang, Incheon (KR); Gayeun Kim, Seoul (KR); YoungUk Noh, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 576 days.

(21) Appl. No.: 17/820,502

(22) Filed: Aug. 17, 2022

(65) Prior Publication Data

US 2024/0063194 A1    Feb. 22, 2024

(51) Int. Cl.
*H01L 25/16* (2023.01)
*H01L 21/56* (2006.01)
(Continued)

(52) U.S. Cl.
CPC ............ *H01L 25/162* (2013.01); *H01L 21/56* (2013.01); *H01L 23/481* (2013.01);
(Continued)

(58) Field of Classification Search
CPC ................ H01L 21/56; H01L 21/6835; H01L 21/76895; H01L 23/481; H01L 23/49833; H01L 23/5383; H01L 23/5389; H01L 23/552; H01L 23/5386; H01L 23/3121; H01L 23/49838; H01L 23/5385; H01L 23/66; H01L 24/05; H01L 24/13; H01L 24/16; H01L 24/32; H01L 24/73; H01L 24/19; H01L 24/92; H01L 24/97; H01L 24/20; H01L 24/08; H01L 25/162;
(Continued)

(56) References Cited

U.S. PATENT DOCUMENTS 7,989,707 B2    8/2011  Yamano et al.
10,756,075 B2   8/2020  Hong et al.
(Continued)

*Primary Examiner* — Marlon T Fletcher
*Assistant Examiner* — Christina A Sylvia
(74) *Attorney, Agent, or Firm* — Robert D. Atkins; PATENT LAW GROUP: Atkins and Associates, P.C.

(57) ABSTRACT

A semiconductor device has a first semiconductor package, second semiconductor package, and RDL. The first semiconductor package is disposed over a first surface of the RDL and the second semiconductor package is disposed over a second surface of the RDL opposite the first surface of the RDL. A carrier is initially disposed over the second surface of the RDL and removed after disposing the first semiconductor package over the first surface of the RDL. The first semiconductor package has a substrate, plurality of conductive pillars formed over the substrate, electrical component disposed over the substrate, and encapsulant deposited around the conductive pillars and electrical component. A shielding frame can be disposed around the electrical component. An antenna can be disposed over the first semiconductor package. A portion of the encapsulant is removed to planarize a surface of the encapsulant and expose the conductive pillars.

18 Claims, 22 Drawing Sheets

(51) Int. Cl.
  *H01L 23/48* (2006.01)
  *H01L 23/498* (2006.01)
  *H01L 23/538* (2006.01)
  *H01L 23/552* (2006.01)
  *H01L 25/00* (2006.01)
  *H01L 25/065* (2023.01)
  *H01L 23/00* (2006.01)

(52) U.S. Cl.
  CPC .... *H01L 23/49833* (2013.01); *H01L 23/5383* (2013.01); *H01L 23/5389* (2013.01); *H01L 23/552* (2013.01); *H01L 25/0655* (2013.01); *H01L 25/50* (2013.01); *H01L 24/05* (2013.01); *H01L 24/13* (2013.01); *H01L 24/16* (2013.01); *H01L 24/32* (2013.01); *H01L 24/73* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/32225* (2013.01); *H01L 2224/73253* (2013.01); *H01L 2924/01322* (2013.01)

(58) Field of Classification Search
  CPC ... H01L 25/50; H01L 25/0655; H01L 25/165; H01L 25/105; H01L 25/0657; H01L 25/16; H01L 25/18; H01L 2221/68359; H01L 2223/6677; H01L 2224/05611; H01L 2224/05624; H01L 2224/05639; H01L 2224/05644; H01L 2224/05647; H01L 2224/05655; H01L 2224/13111; H01L 2224/13113; H01L 2224/13116; H01L 2224/13124; H01L 2224/13139; H01L 2224/13144; H01L 2224/13147; H01L 2224/13155; H01L 2224/16227; H01L 2224/32225; H01L 2224/73253; H01L 2224/02371; H01L 2224/02372; H01L 2224/02381; H01L 2225/107; H01L 2225/1041; H01L 2225/1023; H01L 2924/01322; H01Q 1/2283
  See application file for complete search history.

(56) References Cited

U.S. PATENT DOCUMENTS

| | | | |
|---|---|---|---|
| 2010/0237477 A1* | 9/2010 | Pagaila | H01L 25/105 257/E23.114 |
| 2015/0061095 A1* | 3/2015 | Choi | H01L 23/5385 257/777 |
| 2016/0027764 A1* | 1/2016 | Kim | H01L 25/105 257/686 |
| 2017/0154878 A1* | 6/2017 | Kim | H01L 25/50 |
| 2017/0358557 A1 | 12/2017 | Chen et al. | |
| 2018/0122764 A1* | 5/2018 | Chen | H01L 24/18 |
| 2020/0161267 A1* | 5/2020 | Jeng | H01L 23/3135 |
| 2020/0328144 A1* | 10/2020 | Fan | H01L 21/56 |
| 2022/0199545 A1* | 6/2022 | Kim | H01L 21/565 |

* cited by examiner

SEMICONDUCTOR DEVICE AND METHOD OF FORMING MODULE-IN-PACKAGE STRUCTURE USING REDISTRIBUTION LAYER

FIELD OF THE INVENTION

The present invention relates in general to semiconductor devices and, more particularly, to a semiconductor device and method of forming a module-in-package structure using a redistribution layer.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One or more semiconductor die can be integrated into a semiconductor package for higher density in a small space and extended electrical functionality. The trend is toward higher performance, higher integration, and miniaturization for applications, such as 5G communications. Yet, the high number of packages and functions that must be assembled for the application results in a large size module. Thermal management also become an issue with designing large modules. The lead length between packages within the module increases propagation delay and transmission loss.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
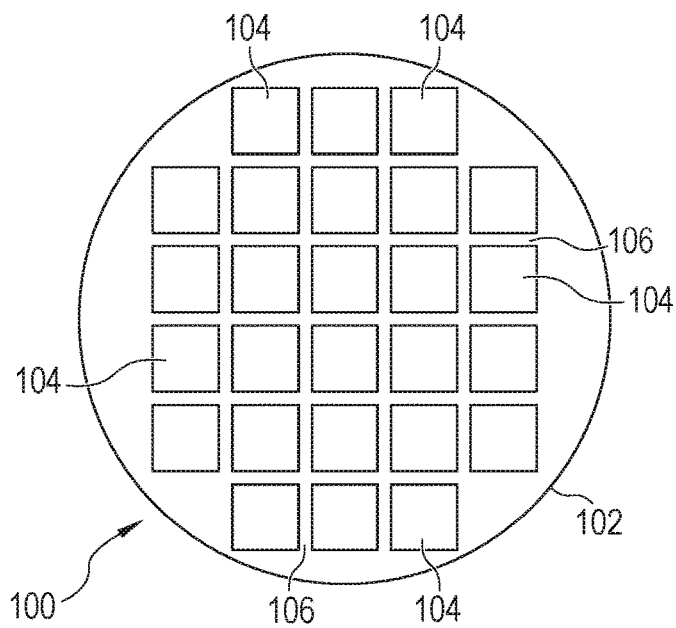
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
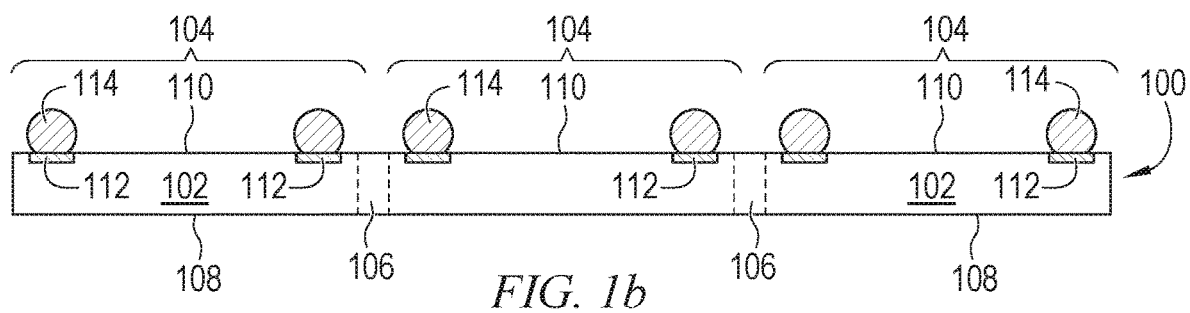

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
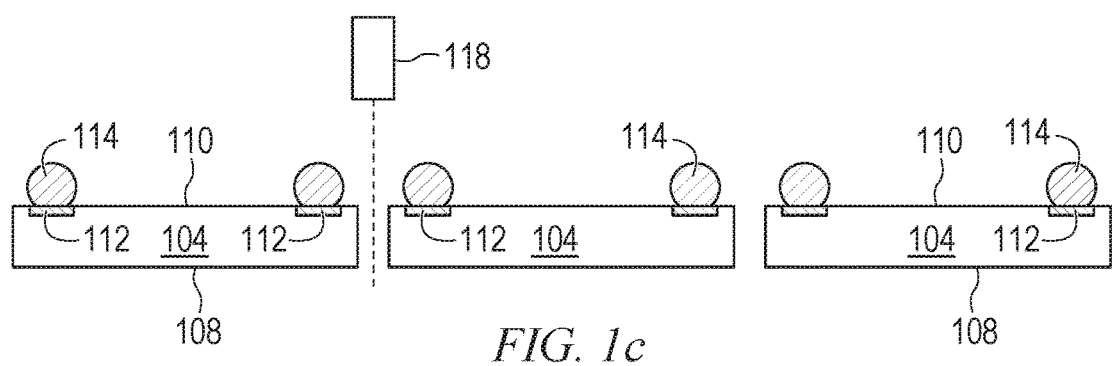

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2A:
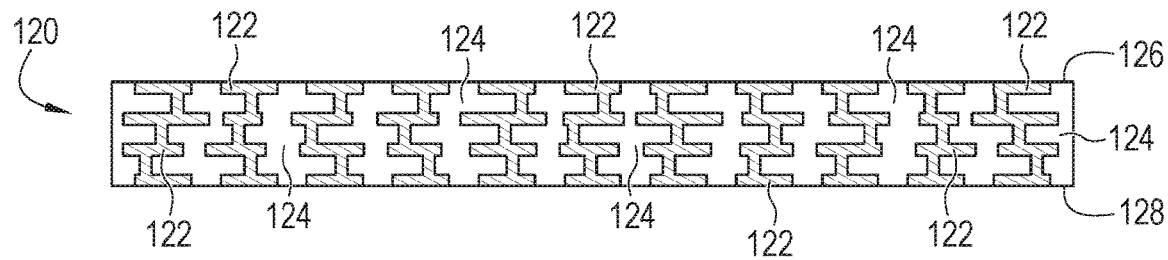
FIGS. 2a-2f illustrate a process of forming a first semiconductor package with electrical components and conductive pillars disposed over a first interconnect substrate.

FIGS. 2a-2f illustrate a process of forming a first semiconductor package with electrical components and conductive pillars disposed over an interconnect substrate. FIG. 2a shows a cross-sectional view of interconnect substrate 120 including conductive layers 122 and insulating layers 124. Conductive layers 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layers 122 provide horizontal electrical interconnect across substrate 120 and vertical electrical interconnect between top surface 126 and bottom surface 128 of substrate 120. Portions of conductive layers 122 can be electrically common or electrically isolated depending on the design and function of semiconductor die 104 and other electrical components. Insulating layers 124 contain one or more layers of silicon dioxide (SiO2), silicon nitride (Si3N4), silicon oxynitride (SiON), tantalum pentoxide (Ta2O5), aluminum oxide (Al2O3), photoresist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layers 124 provide isolation between conductive layers 122. In one embodiment, substrate 120 is a PCB or interconnect substrate.

Figure 2B:
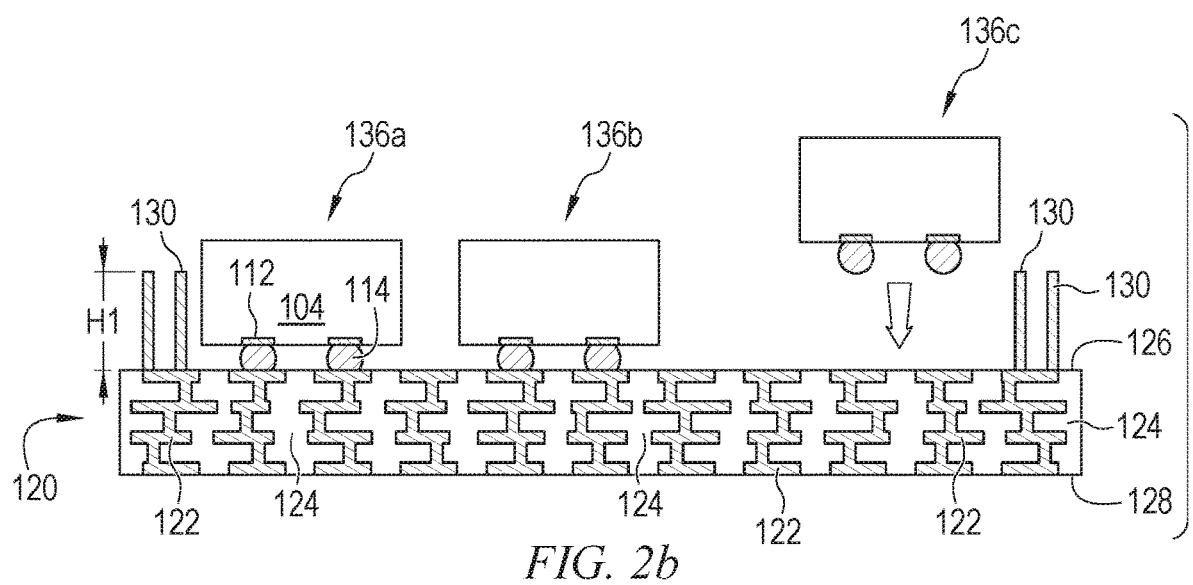

In FIG. 2b, a plurality of conductive columns or pillars 130 is formed on conductive layer 122 of surface 126 of interconnect substrate 120. A photoresist can be formed over surface 126. The photoresist is etched to form vias for the locations of conductive pillars 130. The vias are filled with conductive material and the photoresist is removed leaving conductive pillars 130. Conductive pillars 130 can be Al, Cu, Sn, Ni, Au, Ag, or other suitable electrically conductive material. In one embodiment, conductive pillar 130 has a height H1 of 100 µm.

A plurality of electrical components 136a-136c is disposed on surface 126 of interconnect substrate 120 and electrically and mechanically connected to conductive layers 122. Electrical components 136a-136c are each positioned over substrate 120 using a pick and place operation. For example, electrical component 136a can be similar to semiconductor die 104 from FIG. 1c with bumps 114 oriented toward surface 126 of substrate 120. Electrical components 136b and 136c can be made similar to semiconductor die 104 from FIGS. 1a-1c, possibly with a different form and function. Alternatively, electrical components 136a-136c can include other semiconductor die, semiconductor packages, surface mount devices, discrete electrical devices or IPDs, such as a diode, transistor, resistor, capacitor, and inductor.

Figure 2C:
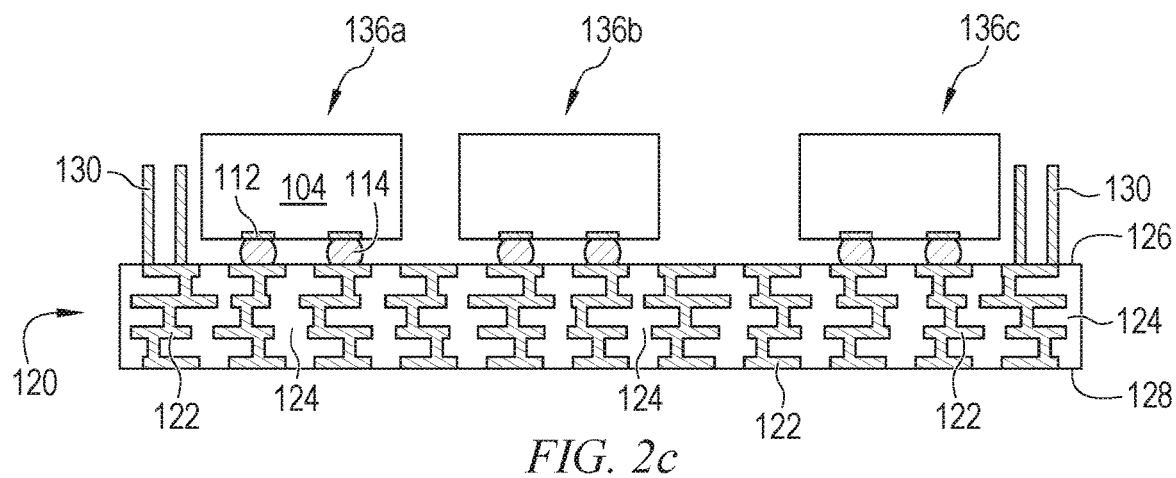

Electrical components 136a-136c are brought into contact with surface 126 of interconnect substrate 120 and bumps 114 are reflowed. FIG. 2c illustrates electrical components 136a-136c electrically and mechanically connected to conductive layers 122 of substrate 120. Alternatively, conductive pillars 130 can be formed after mounting electrical components 136a-136c.

Figure 2D:
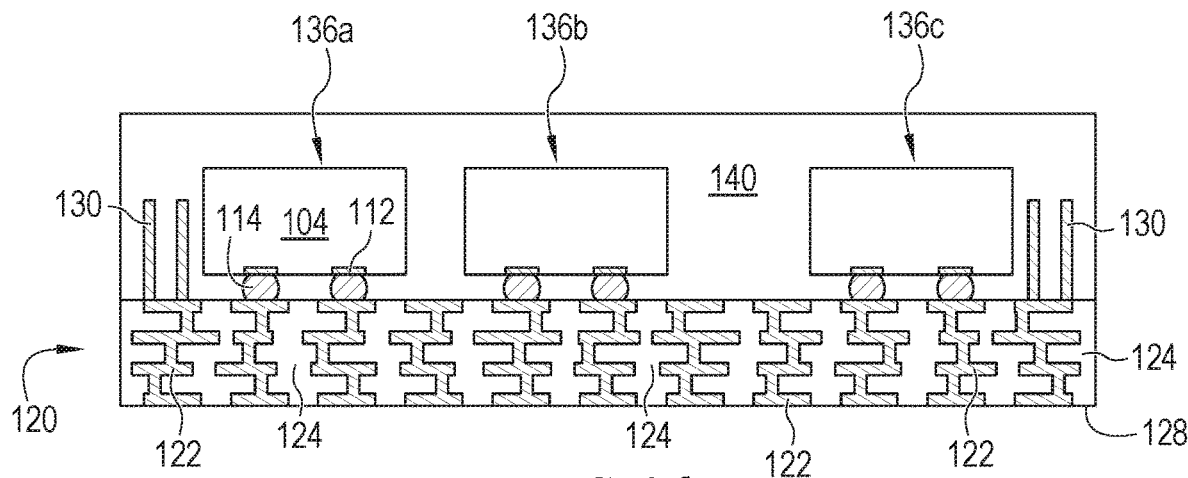

In FIG. 2d, an encapsulant or molding compound 140 is deposited over and around electrical components 136a-136c, conductive pillars 130, and interconnect substrate 120 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants.

Figure 2E:
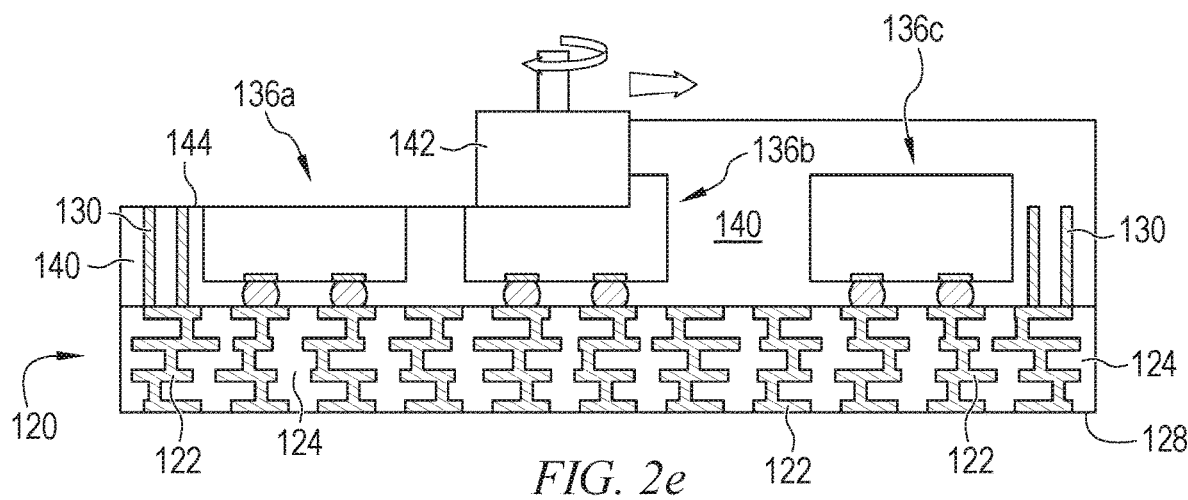
Figure 2F:
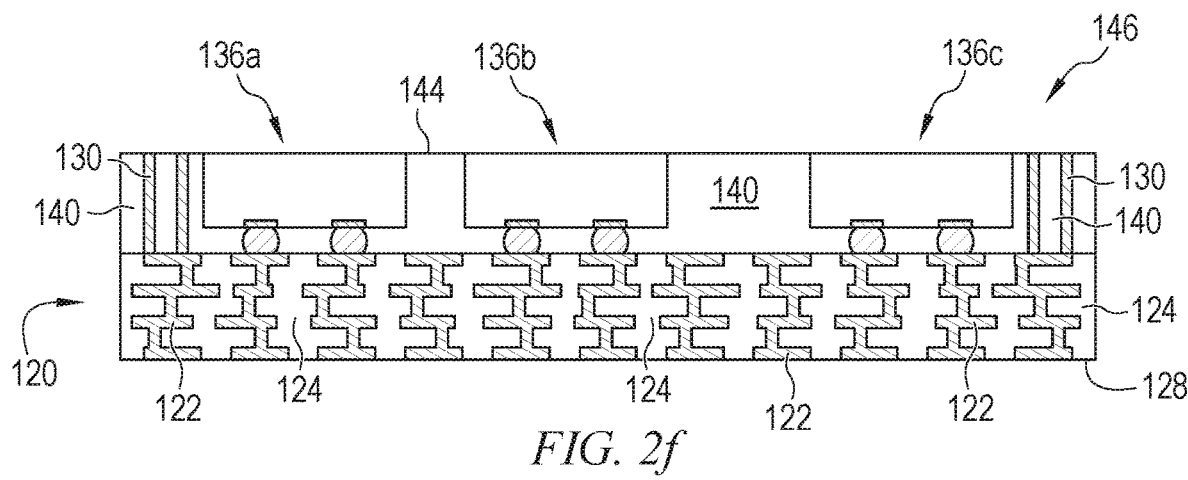

In FIG. 2e, a portion of encapsulant 140 is removed by grinder 142 to planarize surface 144 of the encapsulant and expose conductive pillars 130. Alternatively, a portion of encapsulant 140 is removed by plasma/chemical etch. FIG. 2f shows semiconductor package 146 post grinding. Semiconductor package 146 could be one or more electrical components.

Figure 3A:
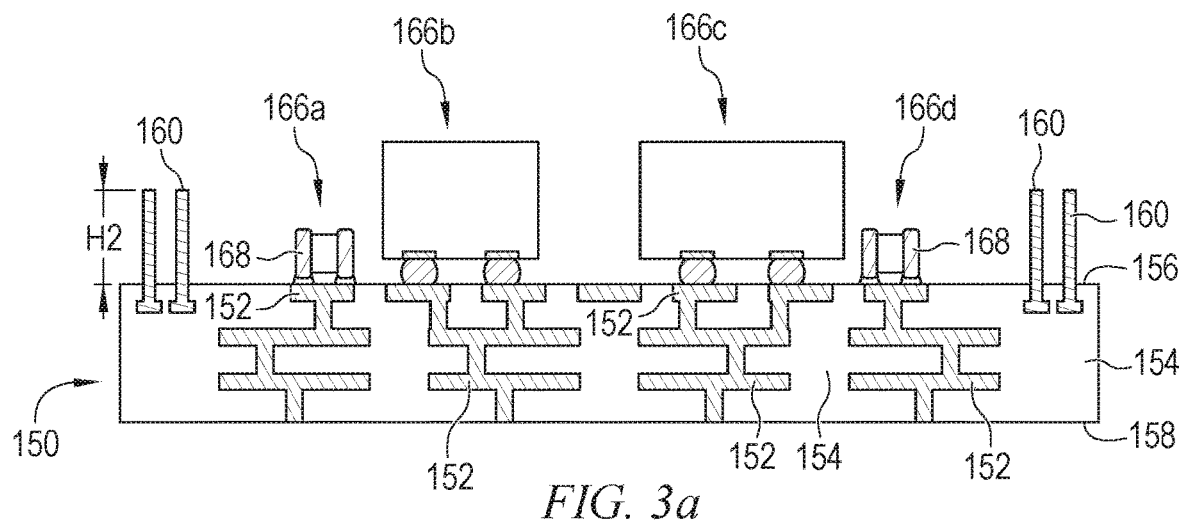
FIGS. 3a-3c illustrate a process of forming a second semiconductor package with electrical components and conductive pillars disposed over a second interconnect substrate.
Figure 3B:
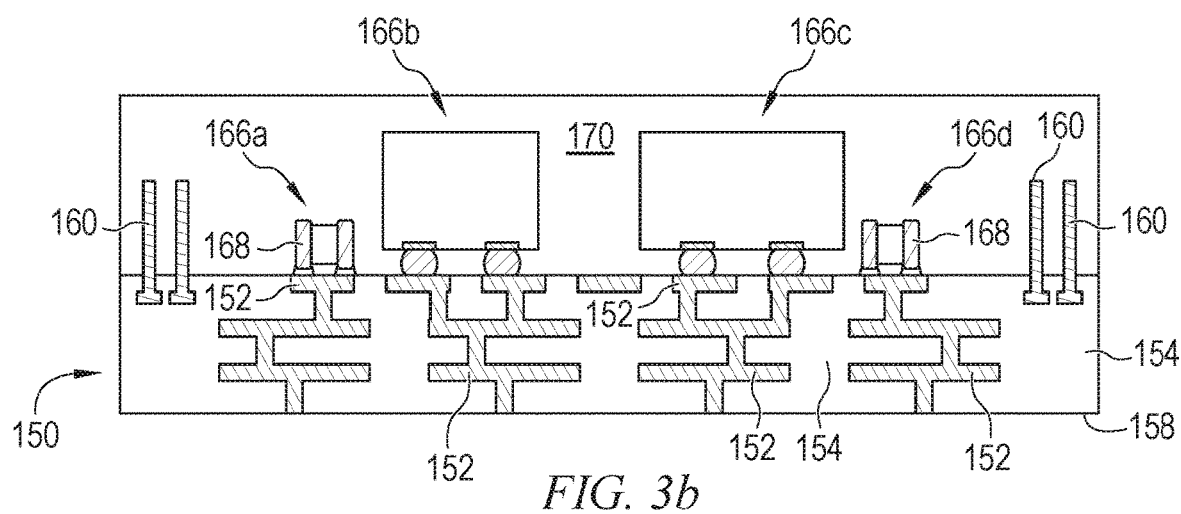
Figure 3C:
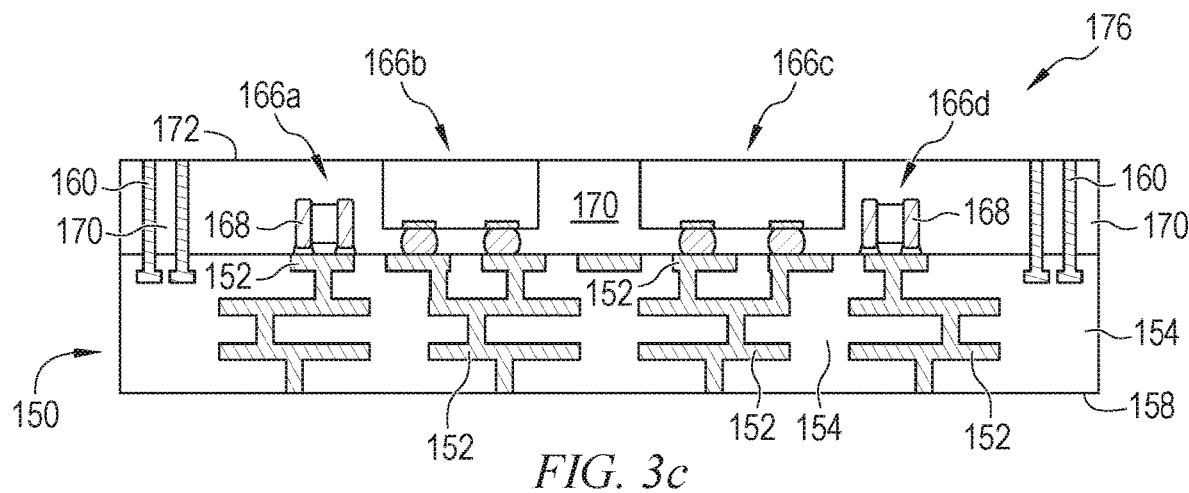

FIGS. 3a-3c illustrate a process of forming a second semiconductor package with electrical components and conductive pillars disposed over a substrate. FIG. 3a shows a cross-sectional view of substrate 150 including conductive layers 152 and insulating layers 154. Conductive layers 152 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layers 152 provide horizontal electrical interconnect across substrate 150 and vertical electrical interconnect between top surface 156 and bottom surface 158 of substrate 150. Portions of conductive layers 152 can be electrically common or electrically isolated depending on the design and function of semiconductor die 104 and other electrical components. Insulating layers 154 contain one or more layers of SiO2, Si3N4, SiON, Ta2O5, Al2O3, photoresist, polyimide, BCB, PBO, and other material having similar insulating and structural properties. Insulating layers can be formed using PVD, CVD, printing, lamination, spin coating, spray coating, sintering or thermal oxidation. Insulating layers 154 provide isolation between conductive layers 152. In one embodiment, substrate 150 is a PCB or interconnect substrate.

A plurality of conductive columns or pillars 160 is formed on conductive layer 152 of surface 156 of substrate 150, similar to FIG. 2b. Conductive pillars 160 can be Al, Cu, Sn, Ni, Au, Ag, or other suitable electrically conductive material. In one embodiment, conductive pillar 160 has a height H2 of 100 μm.

A plurality of electrical components 166a-166d is disposed on surface 156 of substrate 150 and electrically and mechanically connected to conductive layers 152 by reflow, similar to FIG. 2b. Electrical components 166b-166c can be made similar to semiconductor die 104 from FIGS. 1a-1c, although with a different form and function. Electrical components 166a and 166d can be discrete electrical devices, or IPDs, such as a diode, transistor, resistor, capacitor, and inductor, with terminals 168 disposed on surface 156 of substrate 150 and electrically and mechanically connected to conductive layers 152. Alternatively, electrical components 166a-166d can include other semiconductor die, semiconductor packages, surface mount devices, discrete electrical devices or IPDs, such as a diode, transistor, resistor, capacitor, and inductor.

In 3b, an encapsulant or molding compound 170 is deposited over and around electrical components 166a-166d, conductive pillars 160, and substrate 150 using a paste printing, compressive molding, transfer molding, liquid encapsulant molding, vacuum lamination, spin coating, or other suitable applicator. Encapsulant 170 can be polymer composite material, such as epoxy resin with filler, epoxy acrylate with filler, or polymer with proper filler. Encapsulant 170 is non-conductive, provides structural support, and environmentally protects the semiconductor device from external elements and contaminants.

In FIG. 3c, a portion of encapsulant 170 is removed by a grinder to planarize surface 172 of the encapsulant and expose conductive pillars 160, similar to FIG. 2e. FIG. 3c shows semiconductor package 176 post grinding. Semiconductor package 176 could be one or more electrical components.

Figure 4A:
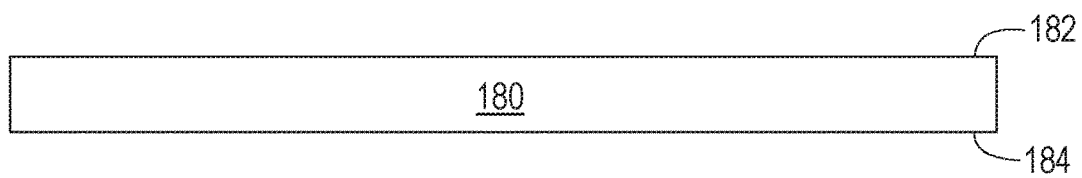
FIGS. 4a-4b illustrate a process of forming an RDL disposed over a temporary carrier.

FIG. 4a illustrates a temporary substrate or carrier 180 sacrificial base material such as silicon, polymer, beryllium oxide, glass, or other suitable low-cost, rigid material for structural support. Carrier 180 has a top major surface 182 and bottom major surface 184.

Figure 4B:
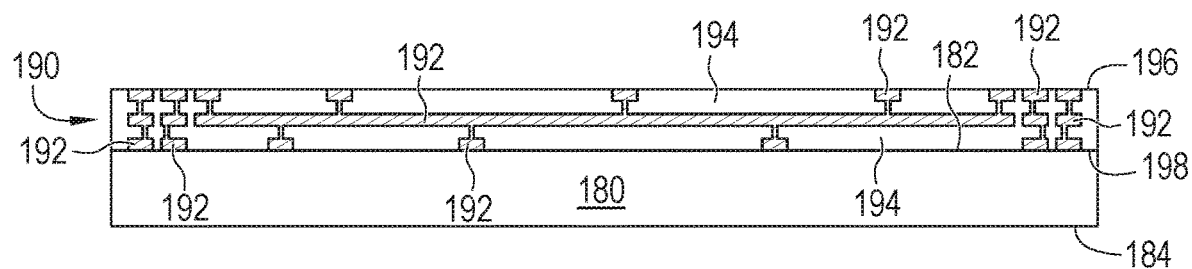

In FIG. 4b, redistribution layer (RDL) 190 is formed over surface 182 of carrier 180. RDL 190 includes conductive layers 192 and insulating layers 194. Conductive layers 192 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layers 192 provide horizontal electrical interconnect across RDL 190 and vertical electrical interconnect between top surface 196 and bottom surface 198. Portions of conductive layers 192 can be electrically common or electrically isolated depending on the design and function of semiconductor die 104 and other electrical components. Insulating layers 194 contain one or more layers of SiO2, Si3N4, SiON, Ta2O5, Al2O3, photoresist, polyimide, BCB, PBO, and other material having similar insulating and structural properties. Insulating layers can be formed using PVD, CVD, printing, lamination, spin coating, spray coating, sintering or thermal oxidation. Insulating layers 194 provide isolation between conductive layers 192.

Figure 5A:
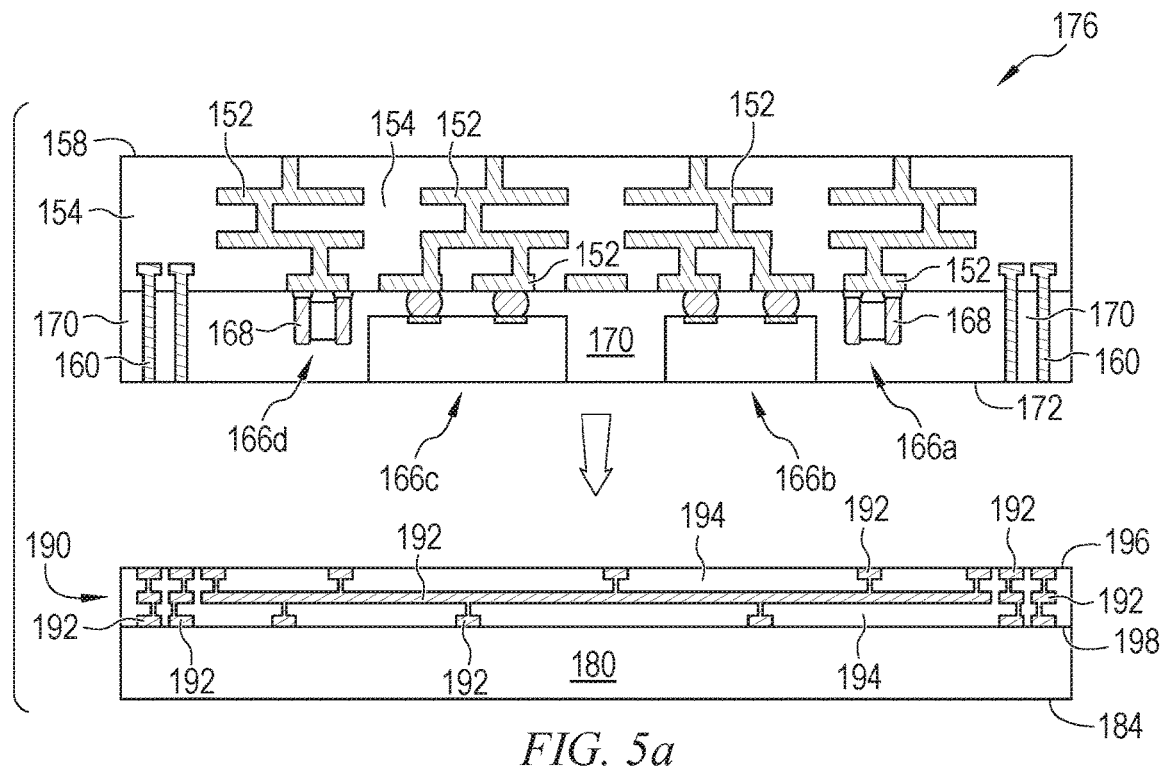
FIGS. 5a-5d illustrate a process of disposing the first semiconductor package and second semiconductor package on opposite sides of the RDL.
Figure 5B:
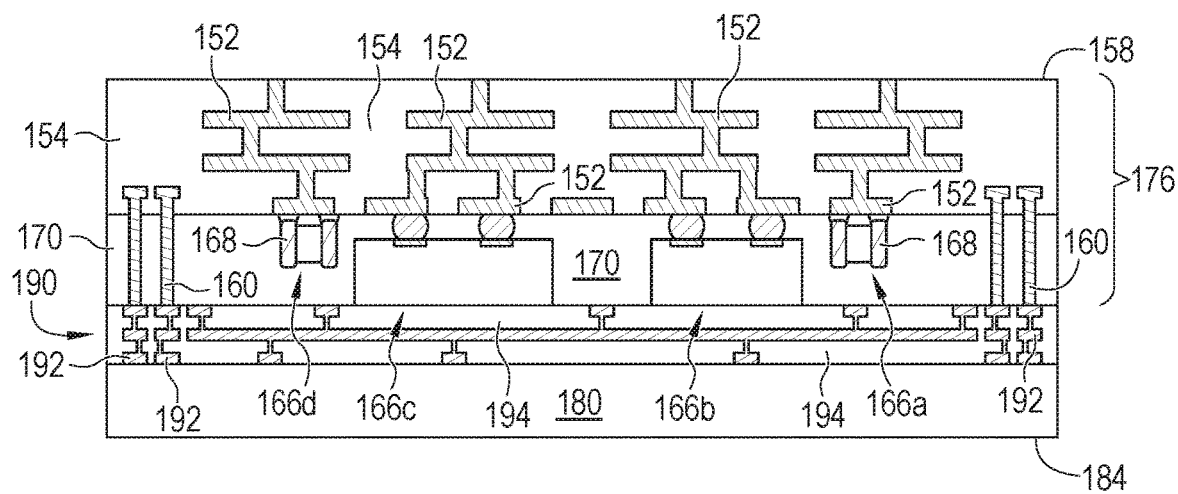

In FIG. 5a, semiconductor package 176 from FIG. 3c is positioned over RDL 190 on carrier 180 with conductive pillars 160 oriented toward surface 196. Semiconductor package 176 is brought into contact with conductive layer 192 of RDL 190 and electrically and mechanically bonded to the RDL, see discussion of FIGS. 6a-6h. FIG. 5b shows semiconductor package 176 bonded to RDL 190.

Figure 5C:
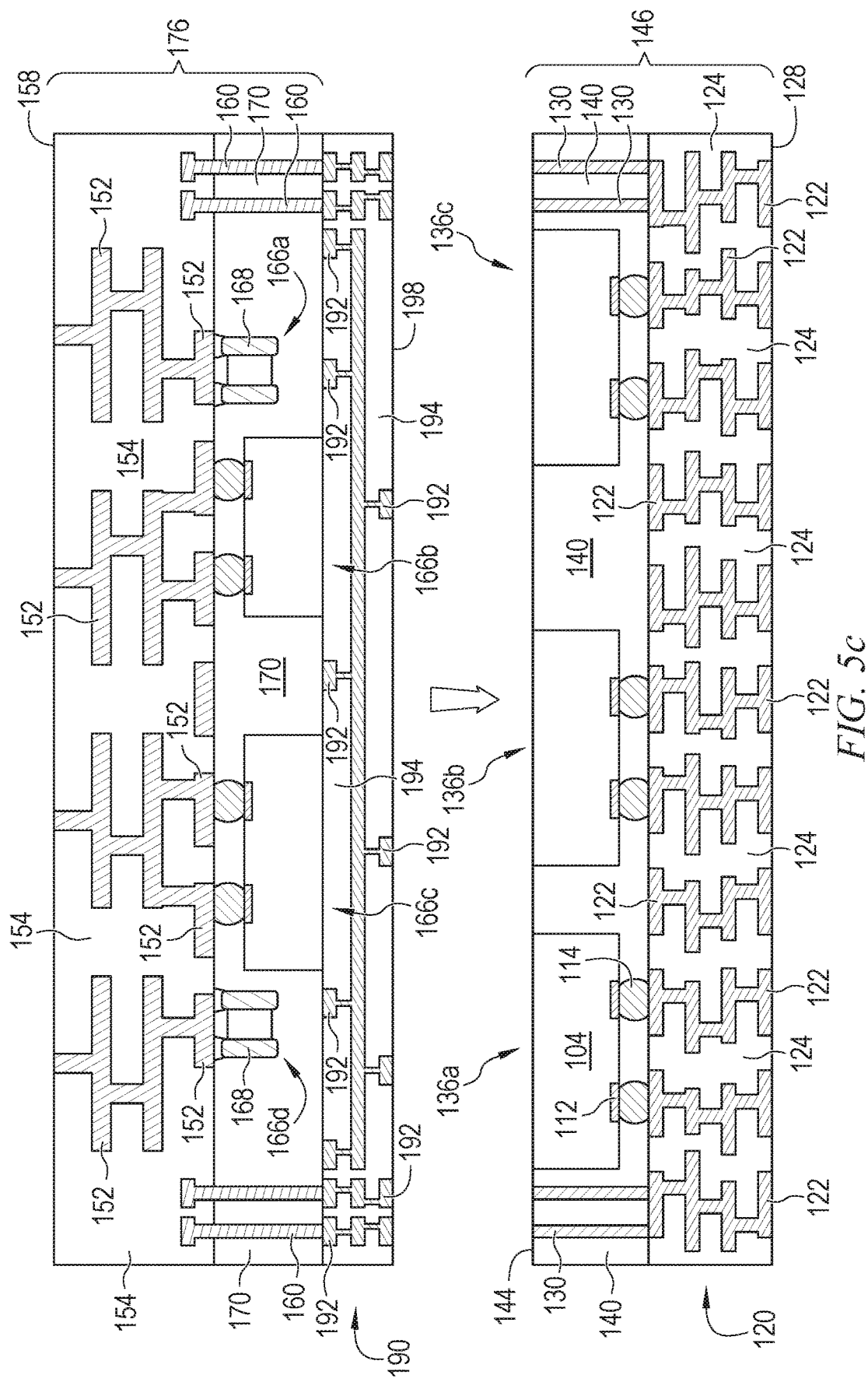
Figure 5D:
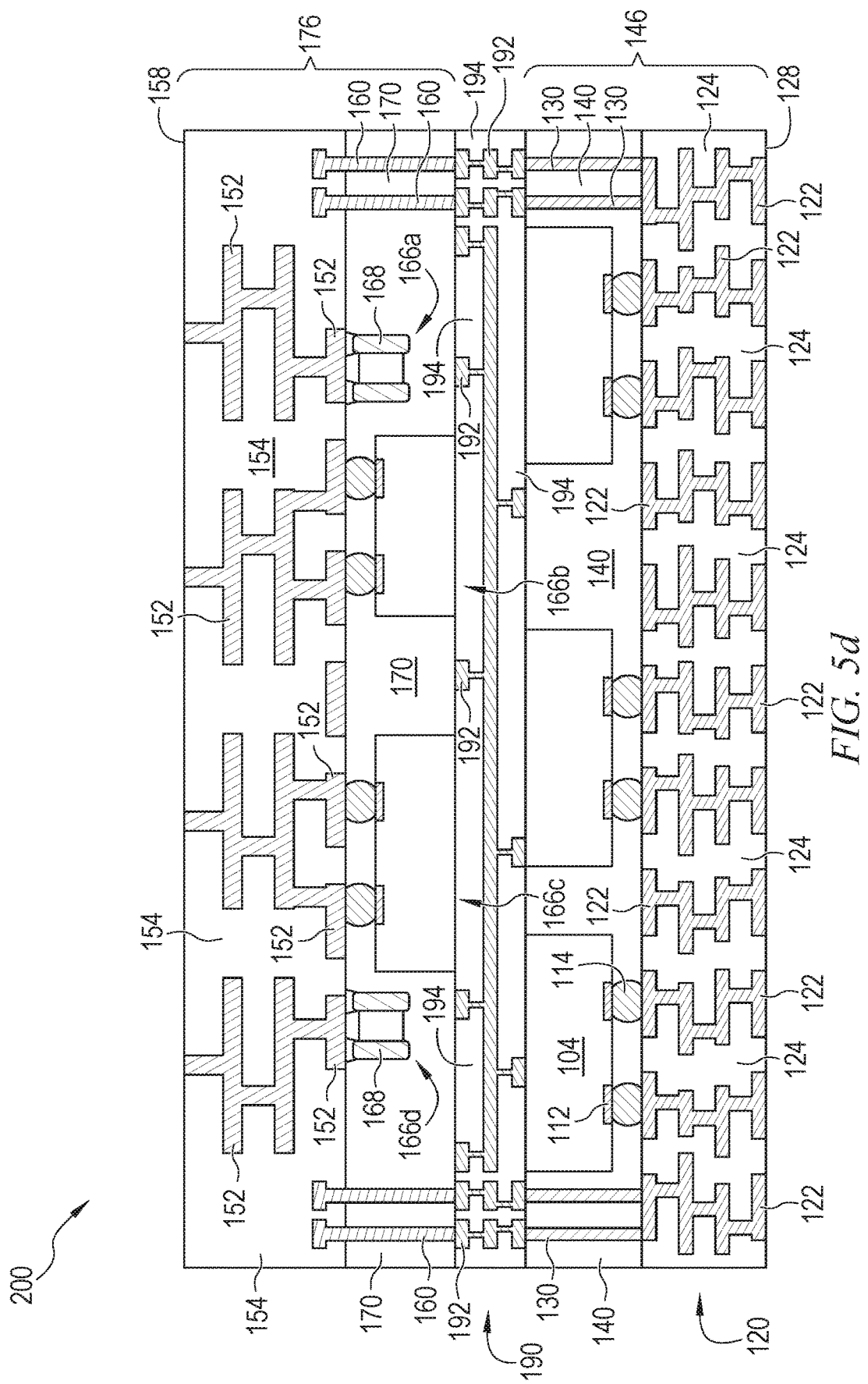

In FIG. 5c, carrier 180 is removed by chemical etching, chemical mechanical polishing (CMP), mechanical peel-off, mechanical grinding, thermal bake, ultra-violet (UV) light, or wet stripping to expose surface 198 of RDL 190. Semiconductor package 176 with RDL 190 is positioned over semiconductor package 146 from FIG. 2f with surface 198 of RDL 190 oriented toward surface 144 of encapsulant 140. RDL 190 is brought into contact with conductive pillars 130 and electrically and mechanically bonded to semiconductor package 146. FIG. 5d shows module-in-package (MiP) 200 containing semiconductor packages 146 and 176 bonded to RDL 190.

MiP 200 provides the function of multiple packages in one module by disposing two different packages 146 and 176 on opposite surfaces of RDL 190. Advanced and complex technologies, such as 5G and hybrid modules, can be achieved in one package. In fact, MiP 200 can achieve many different electrical functions in one package. RDL 190 provides a short and efficient electrical interconnect between semiconductor packages 146 and 176. MiP 200 provides more electrical functionality in a smaller space, and less propagation delay and transmission loss through RDL 190.

Figure 6A:
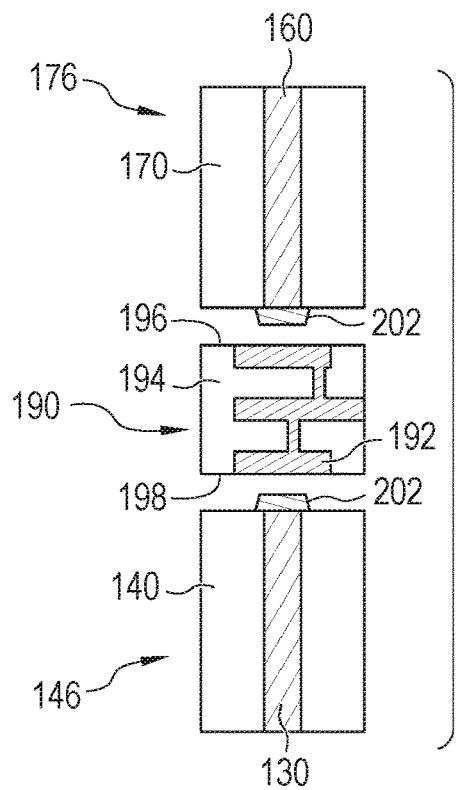
FIGS. 6a-6j illustrate various ways of attaching the first semiconductor package and second semiconductor package to opposite sides of the RDL.
Figure 6B:
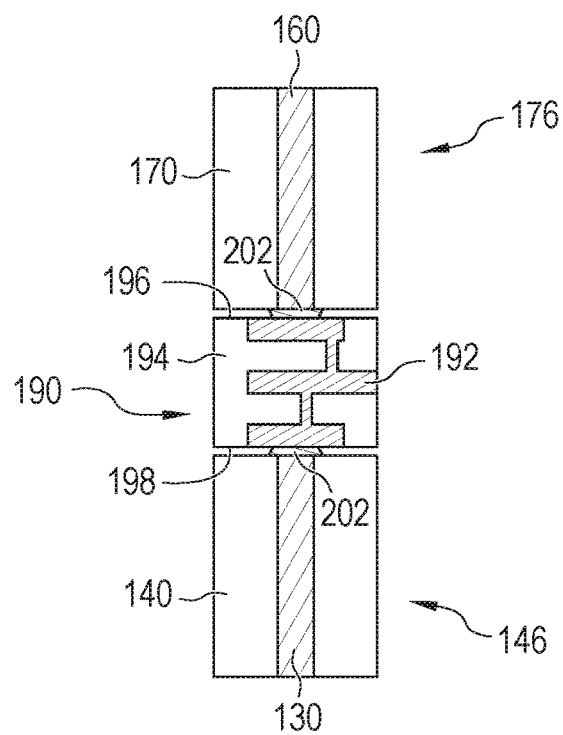

FIGS. 6a-6j illustrate various methods of electrically and mechanically bonding semiconductor package 146 and semiconductor package 176 to RDL 190. FIG. 6a shows a portion of semiconductor packages 146 and 176 on opposite sides of RDL 190. Conductive paste 202 is deposited on conductive pillars 130 and 160. In FIG. 6b, as conductive paste 202 makes contact with conductive layer 192 in RDL 190, the conductive paste is heated and reflowed to make an electrical and mechanical bond between conductive pillar 160 of semiconductor package 176 and conductive layer 192 of RDL 190 and between conductive pillar 130 of semiconductor package 146 and conductive layer 192 of RDL 190. The reflow may occur at a high temperature followed by a low temperature to avoid cracking or other defects in the bond. Alternatively, conductive paste 202 can be deposited on conductive layer 192 of RDL 190. In one embodiment, conductive paste 202 can be low temperature solder (e.g., SnBiAg) to minimize warpage of RDL 190.

Figure 6C:
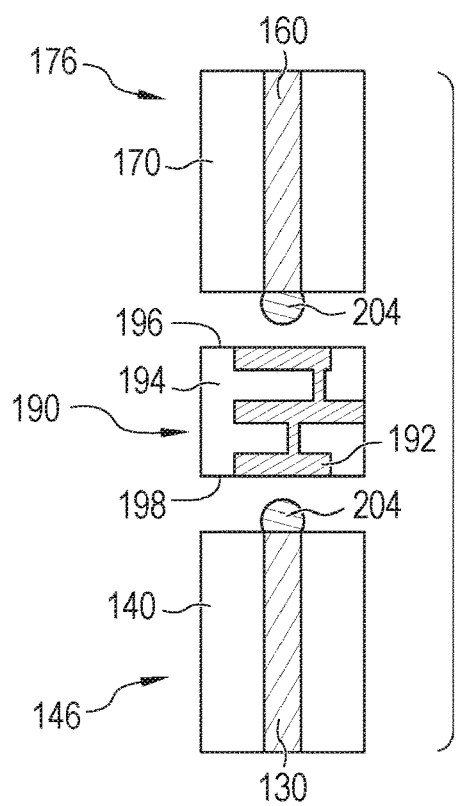
Figure 6D:
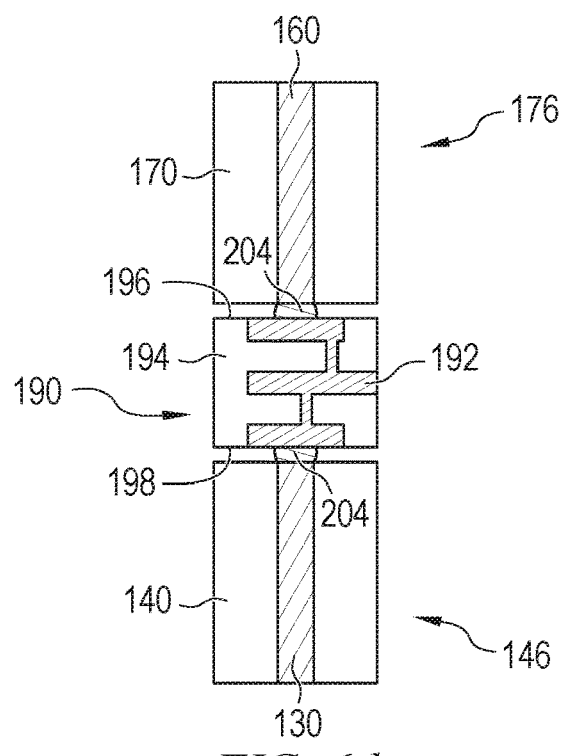

In another embodiment, FIG. 6c shows a portion of semiconductor packages 146 and 176 on opposite sides of RDL 190. Bump material 204 is deposited on conductive pillars 130 and 160. In FIG. 6d, as bump material 204 makes contact with conductive layer 192 in RDL 190, the bump material is heated and reflowed to make an electrical and mechanical bond between conductive pillar 160 of semiconductor package 176 and conductive layer 192 of RDL 190 and between conductive pillar 130 of semiconductor package 146 and conductive layer 192 of RDL 190. In one embodiment, bump material 204 can be low temperature solder (e.g., SnBiAg) to minimize warpage of RDL 190.

Figure 6E:
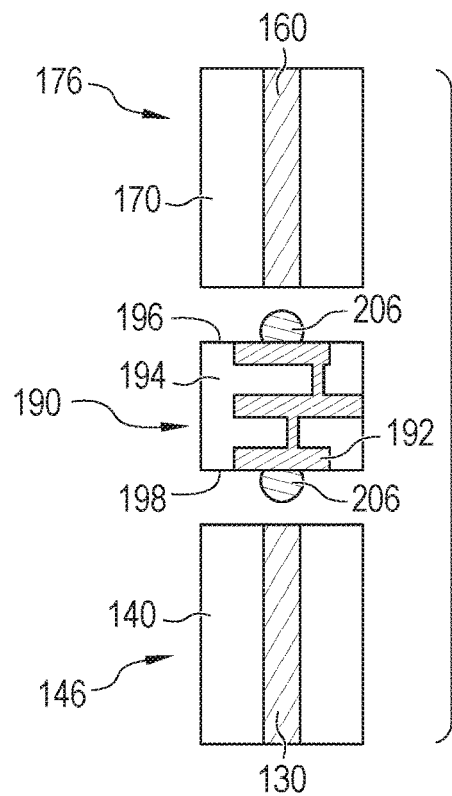
Figure 6F:
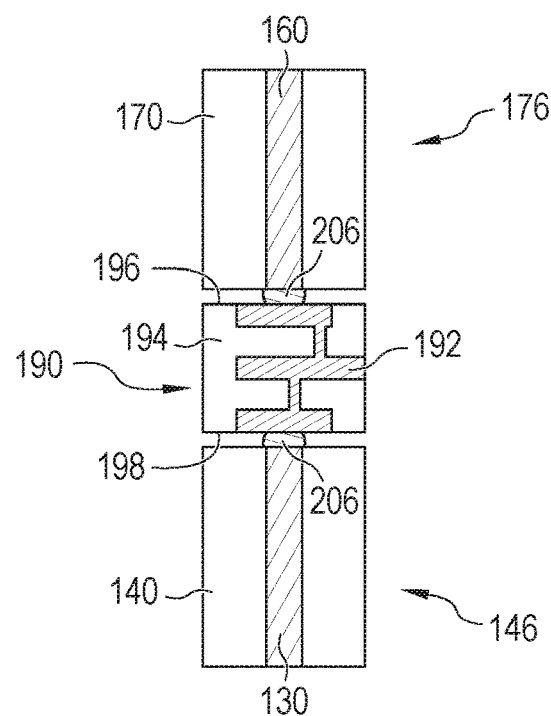

In another embodiment, FIG. 6e shows a portion of semiconductor packages 146 and 176 on opposite sides of RDL 190. Bump material 206 is deposited on conductive layer 192 on opposite surfaces 196 and 198 in RDL 190. In FIG. 6f, as bump material 206 makes contact with conductive pillars 130 and 160, the bump material is heated and reflowed to make an electrical and mechanical bond between conductive pillar 160 of semiconductor package 176 and conductive layer 192 of RDL 190 and between conductive pillar 130 of semiconductor package 146 and conductive layer 192 of RDL 190. In one embodiment, bump material 206 can be low temperature solder (e.g., SnBiAg) to minimize warpage of RDL 190.

Figure 6G:
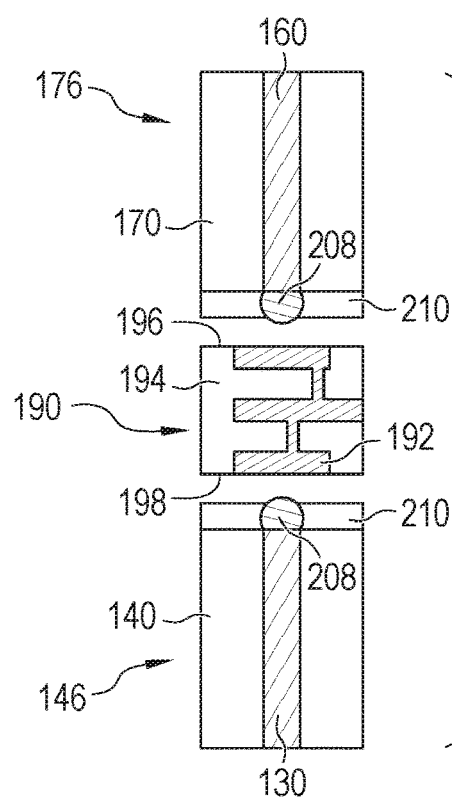
Figure 6H:
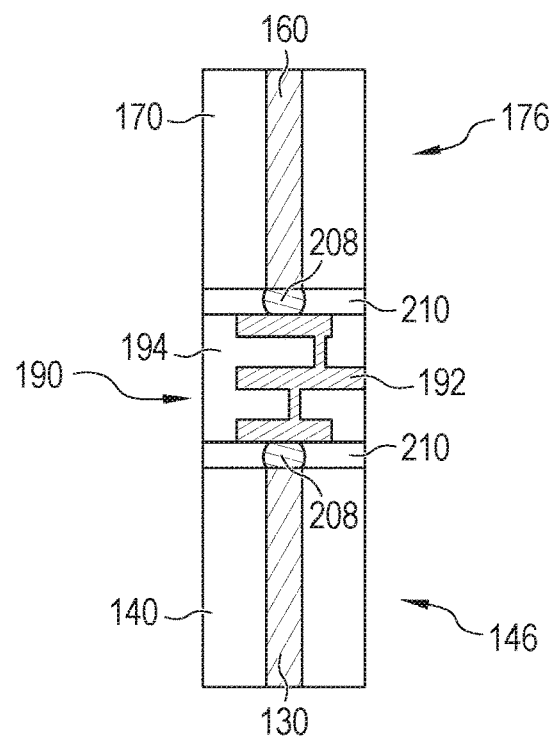

In another embodiment, FIG. 6g shows a portion of semiconductor packages 146 and 176 on opposite surfaces 196 and 198 of RDL 190. Bump material 208 is deposited on conductive pillars 130 and 160. Non-conductive paste (NCP) 210 is deposited around bump material 208 over encapsulant 140 and 170. In FIG. 6h, as bump material 208 makes contact with conductive layer 192 in RDL 190, the bump material is heated and reflowed to make an electrical and mechanical bond between conductive pillar 160 of semiconductor package 176 and conductive layer 192 of RDL 190 and between conductive pillar 130 of semiconductor package 146 and conductive layer 192 of RDL 190. In one embodiment, bump material 208 can be low temperature solder (e.g., SnBiAg) to minimize warpage of RDL 190. NCP 210 seals any gap between semiconductor packages 146 and 176 and RDL 190.

Figure 7A:
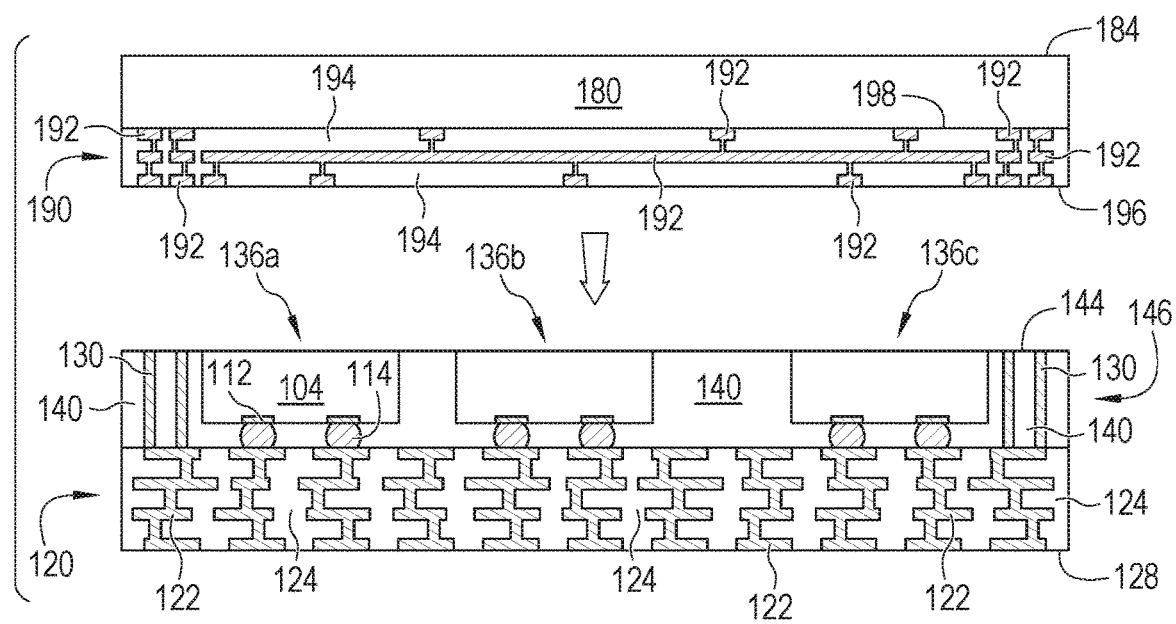
FIGS. 7a-7d illustrate another process of disposing the first semiconductor package and second semiconductor package on opposite sides of the RDL.
Figure 7B:
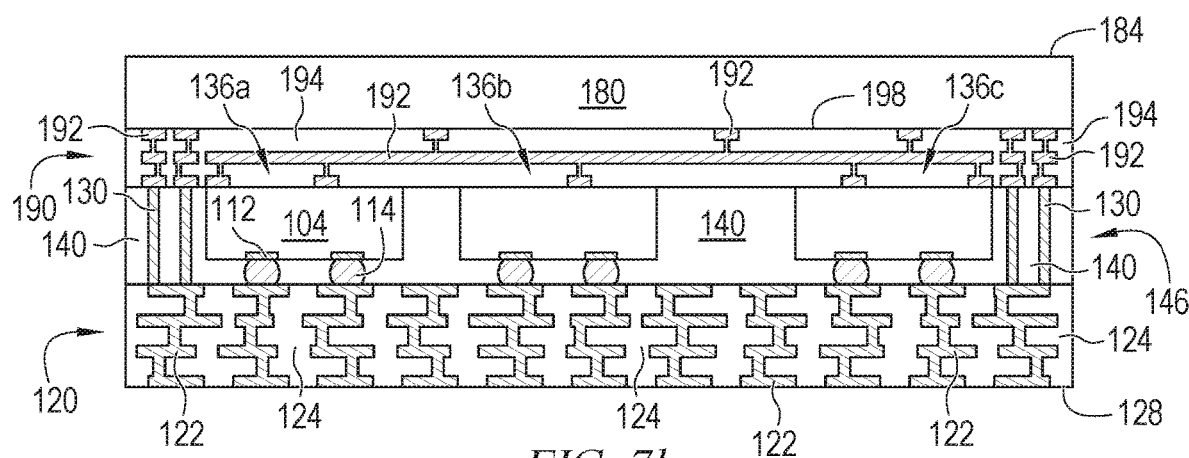

In FIG. 7a, RDL 190 on carrier 180 is positioned over semiconductor package 146 from FIG. 2f with surface 196 oriented toward conductive pillars 130. RDL 190 is brought into contact with semiconductor package 146 and electrically and mechanically bonded to conductive pillars 130, as described in FIGS. 6a-6h. FIG. 7b shows RDL 190 bonded to semiconductor package 146.

Figure 7C:
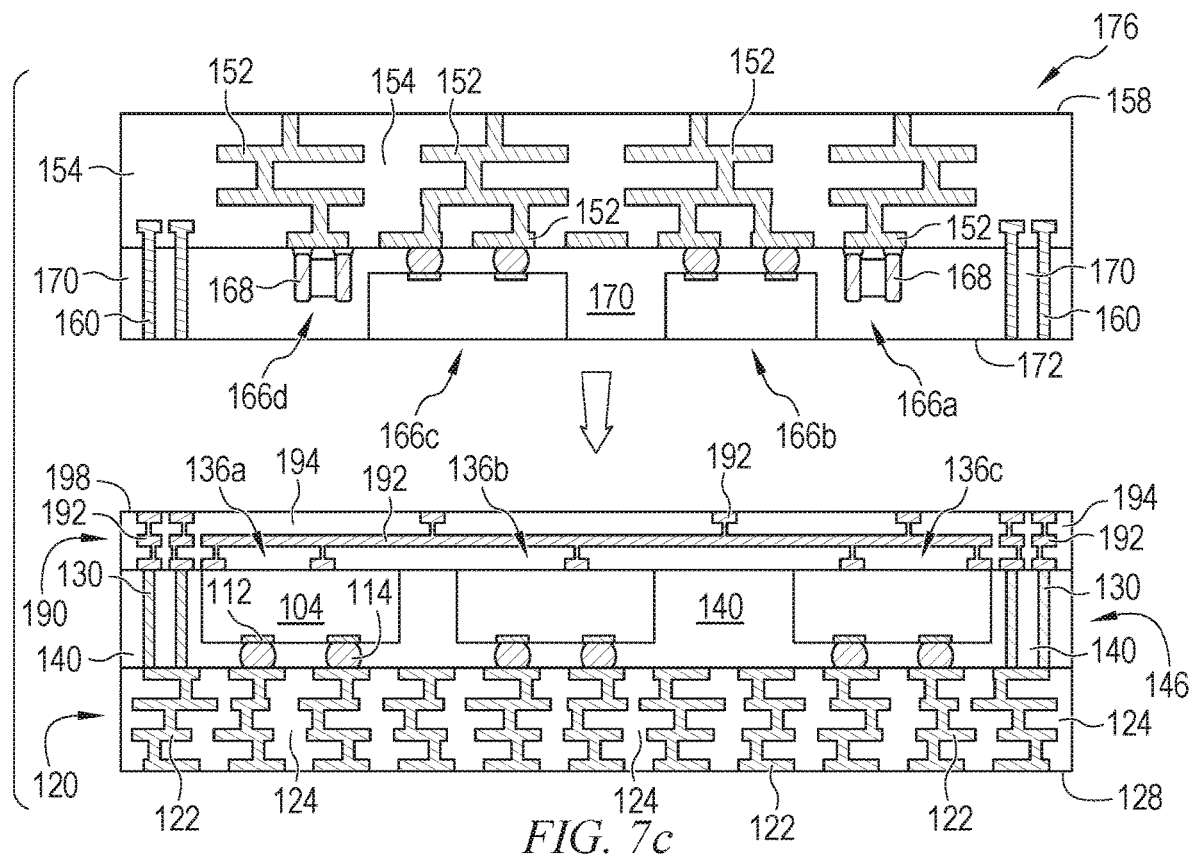
Figure 7D:
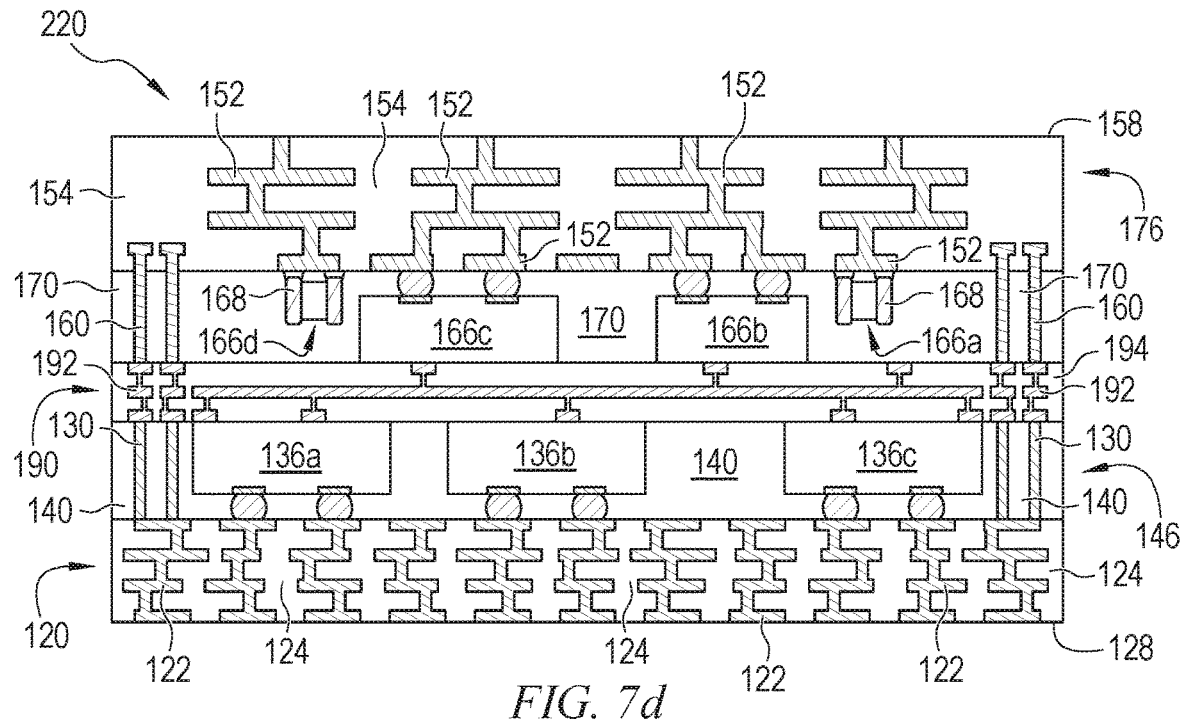

In FIG. 7c, carrier 180 is removed by chemical etching, CMP, mechanical peel-off, mechanical grinding, thermal bake, UV light, or wet stripping to expose surface 198 of RDL 190. Semiconductor package 176 from FIG. 3c is positioned over RDL 190 with conductive pillars 160 oriented toward surface 198. Semiconductor package 176 is brought into contact with RDL 190 and electrically and mechanically bonded to conductive layer 192 of the RDL, as described in FIGS. 6a-6h. FIG. 7d shows MiP 220 containing semiconductor packages 146 and 176 bonded to RDL 190.

Figure 8A:
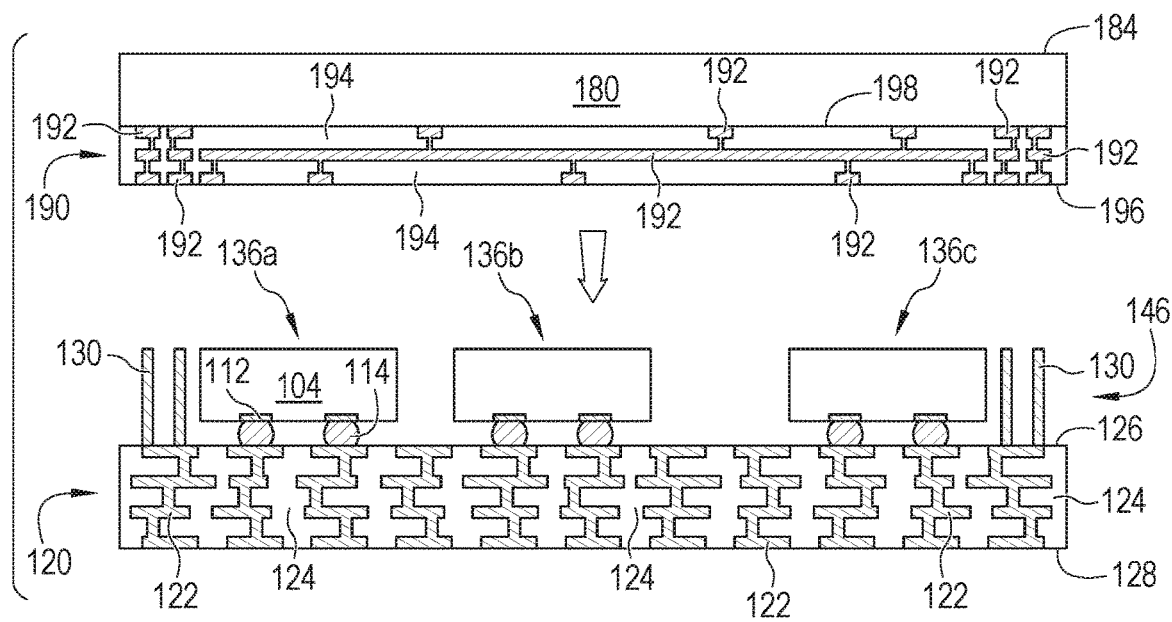
FIGS. 8a-8e illustrate another process of disposing the first semiconductor package and second semiconductor package on opposite sides of the RDL.
Figure 8B:
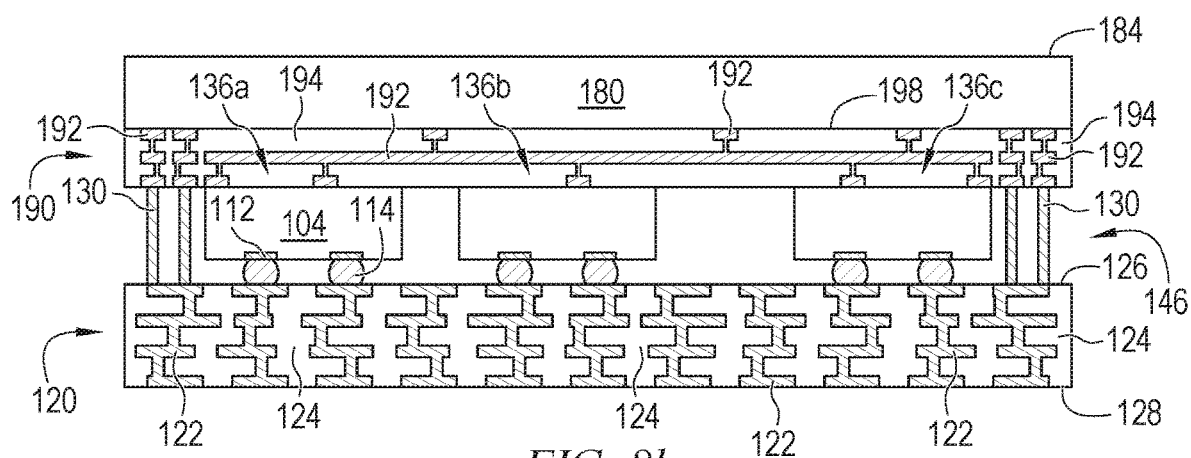

In FIG. 8a, RDL 190 on carrier 180 is positioned over semiconductor package 146 from FIG. 2f, less encapsulant 140, with conductive pillars 130 oriented toward surface 196 of the RDL. RDL 190 is brought into contact with semiconductor package 146 and electrically and mechanically bonded to conductive pillars 130, as described in FIGS. 6i-6j. FIG. 8b shows RDL 190 bonded to semiconductor package 146.

Figure 8C:
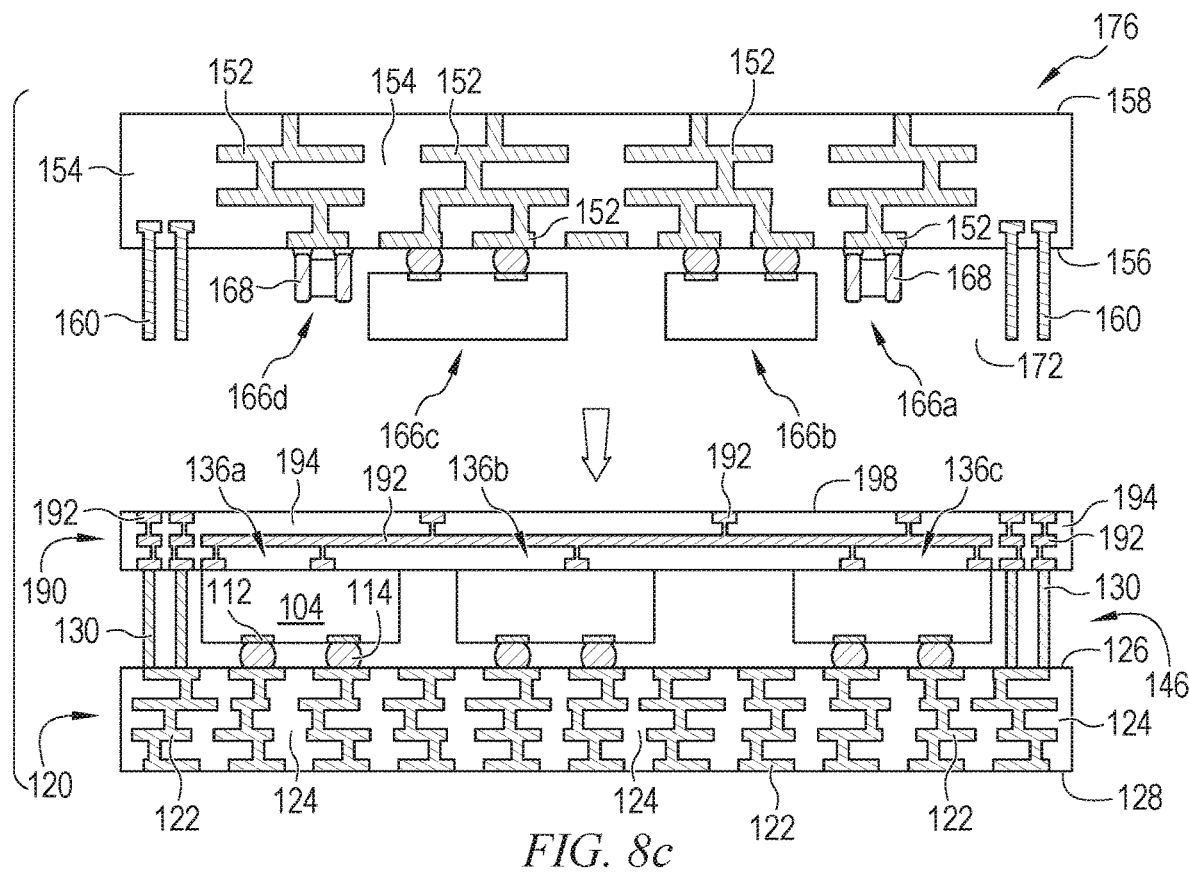
Figure 8D:
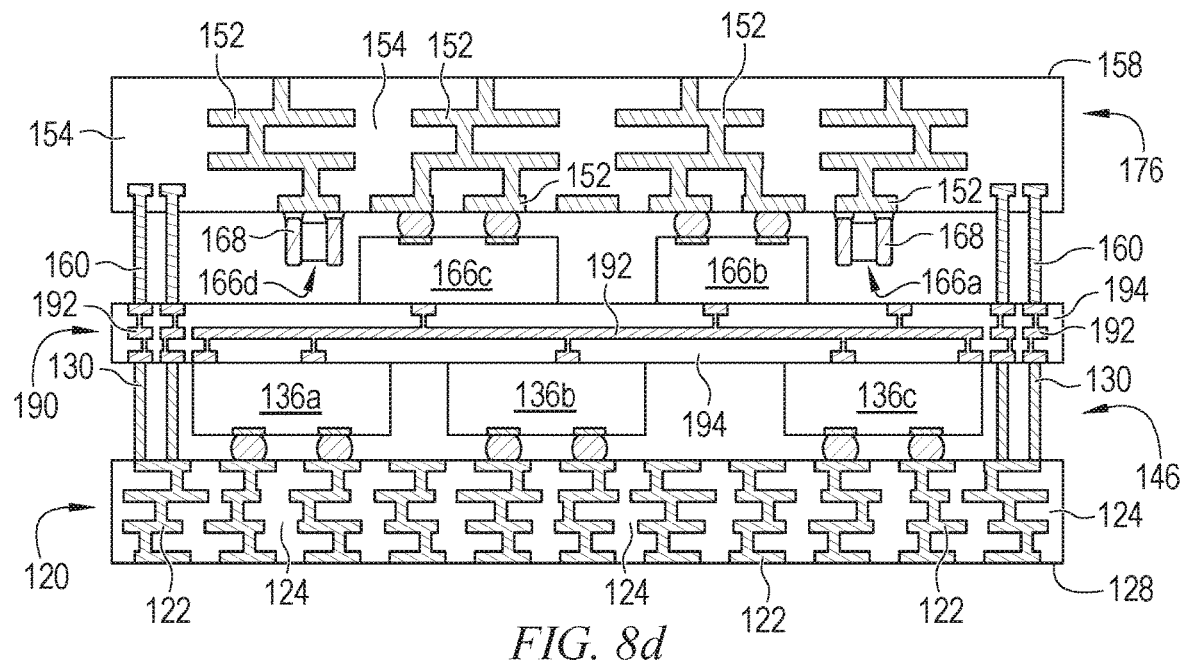

In FIG. 8c, carrier 180 is removed by chemical etching, CMP, mechanical peel-off, mechanical grinding, thermal bake, UV light, or wet stripping to expose surface 198 of RDL 190. Semiconductor package 176 from FIG. 3c, minus encapsulant 170, is positioned over RDL 190 with conductive pillars 160 oriented toward surface 198. Semiconductor package 176 is brought into contact with RDL 190 and electrically and mechanically bonded to the RDL, as described in FIGS. 6i-6j. FIG. 8d shows semiconductor package 176 bonded to RDL 190.

Figure 8E:
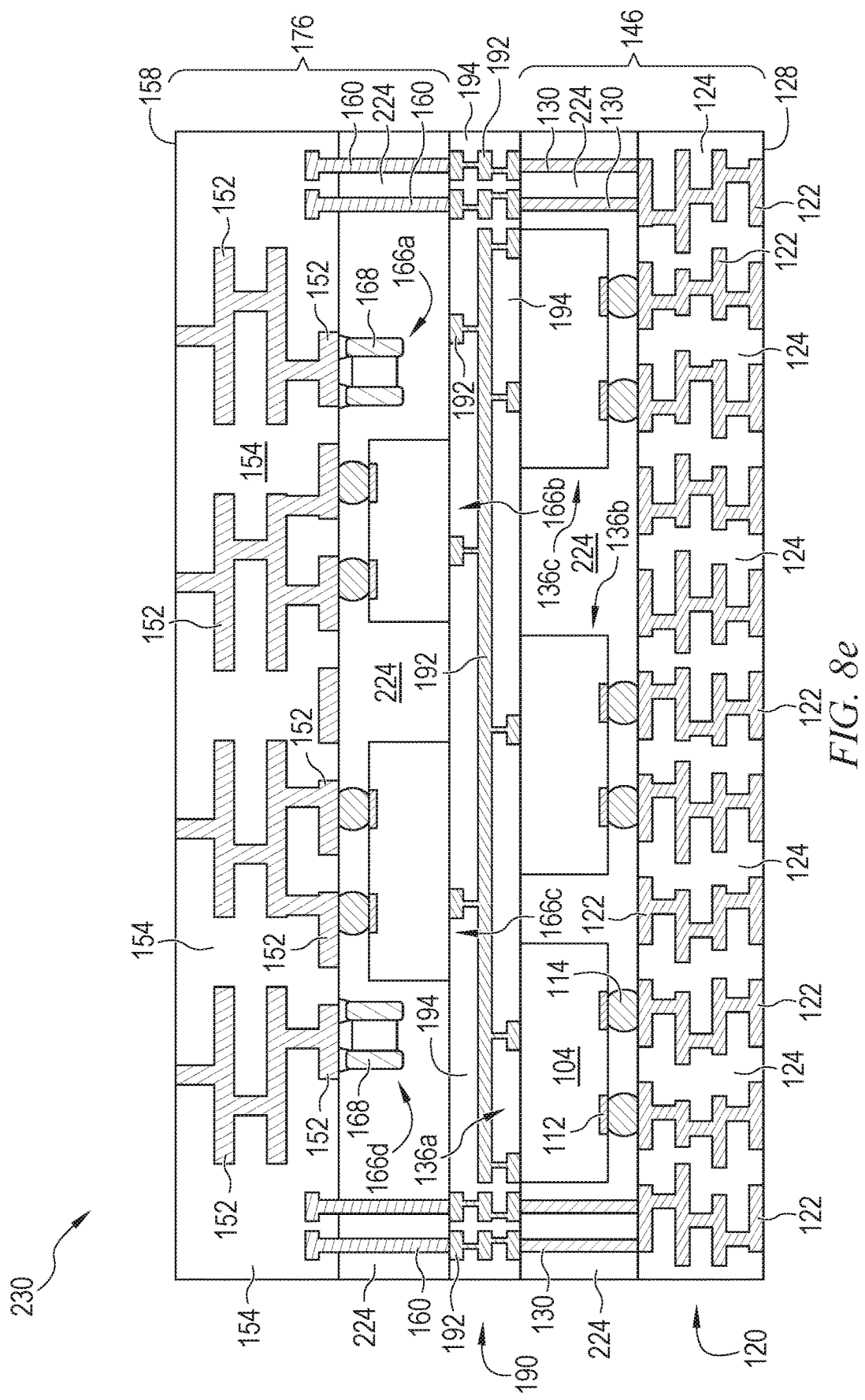

In FIG. 8e, an encapsulant or molding compound 224 is deposited over and around electrical components 136a-136c, electrical components 166a-166d, conductive pillars 130 and 160 using a paste printing, compressive molding, transfer molding, liquid encapsulant molding, vacuum lamination, spin coating, or other suitable applicator. Encapsulant 224 can be polymer composite material, such as epoxy resin with filler, epoxy acrylate with filler, or polymer with proper filler. Encapsulant 224 is non-conductive, provides structural support, and environmentally protects the semiconductor device from external elements and contaminants. MiP 230 contains semiconductor packages 146 and 176 bonded to RDL 190.

Figure 6I:
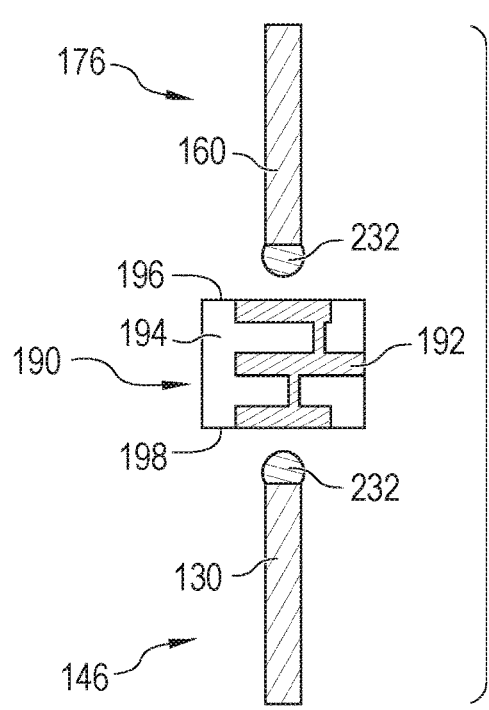
Figure 6J:
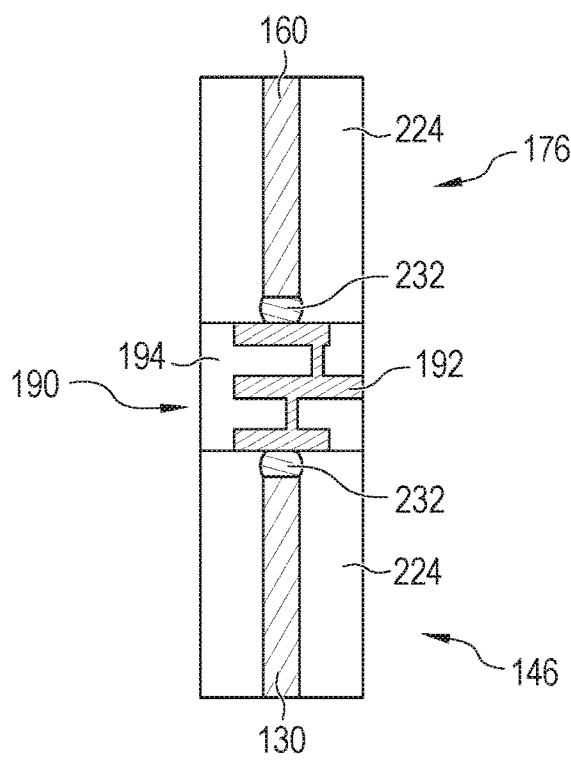

FIG. 6i shows a portion of semiconductor packages 146 and 176 on opposite sides of RDL 190. Bump material 232 is deposited on conductive pillars 130 and 160. In FIG. 6j, as bump material 232 makes contact with conductive layer 192 in RDL 190, the bump material is heated and reflowed to make an electrical and mechanical bond between conductive pillar 160 of semiconductor package 176 and conductive layer 192 of RDL 190 and between conductive pillar 130 of semiconductor package 146 and conductive layer 192 of RDL 190, as in FIG. 8d. Encapsulant 224 is deposited over and around electrical components 136a-136c, electrical components 166a-166d, conductive pillars 130 and 160, as in FIG. 8e.

Electrical components 136a-136c and 166a-166d may contain IPDs that are susceptible to or generate EMI, RFI, harmonic distortion, and inter-device interference. For example, the IPDs contained within electrical components 136a-136c and 166a-166d provide the electrical characteristics needed for high-frequency applications, such as resonators, high-pass filters, low-pass filters, band-pass filters, symmetric Hi-Q resonant transformers, and tuning capacitors. In another embodiment, electrical components 136a-136c and 166a-166d contain digital circuits switching at a high frequency, which could interfere with the operation of other IPDs.

Figure 9A:
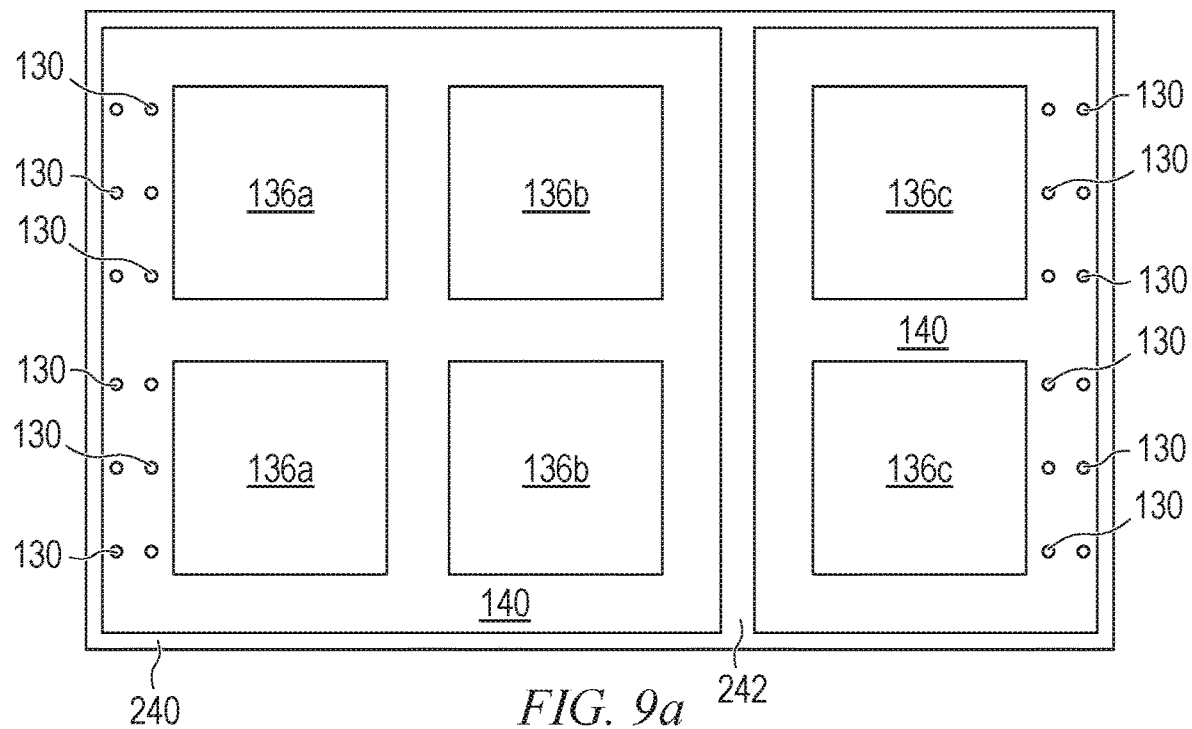
FIGS. 9a-9c illustrate the MiP with a shielding frame around the electric components.
Figure 9B:
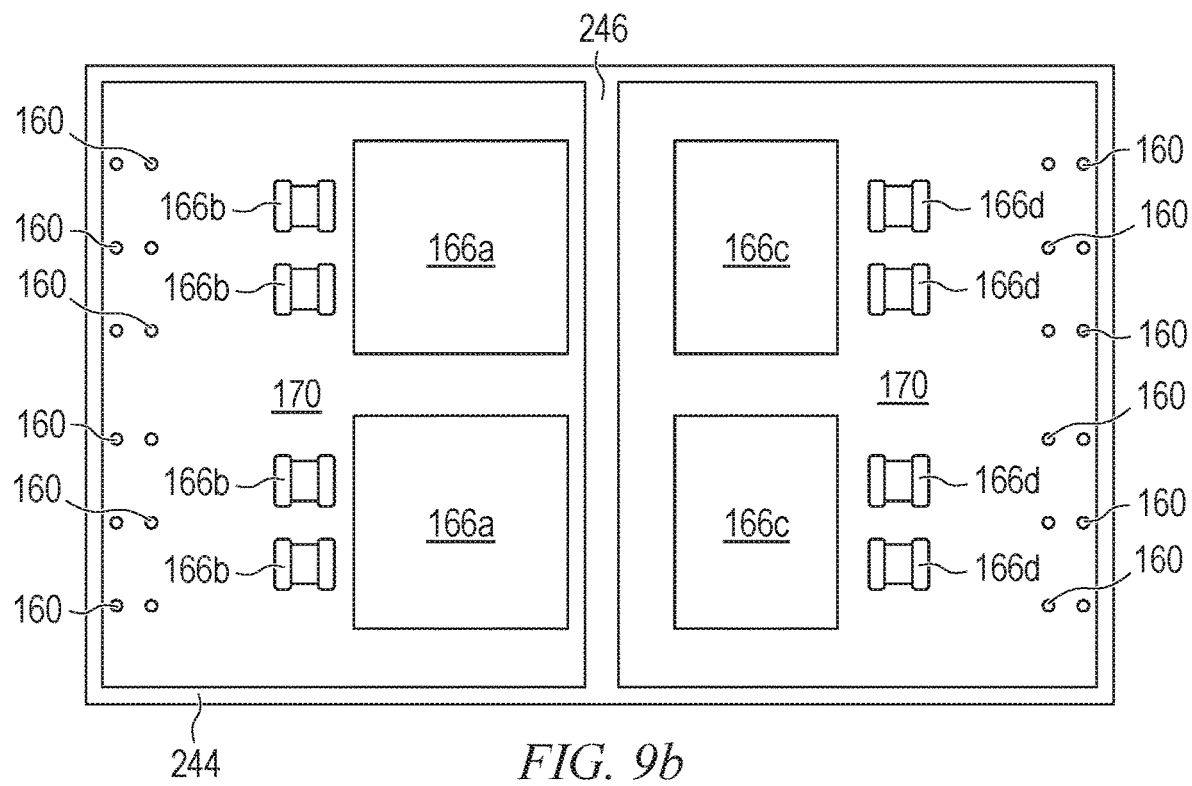

To address EMI, RFI, harmonic distortion, and inter-device interference and continuing from FIG. 2c, a shielding frame 240 is disposed around conductive pillars 130 and electrical components 136a-136c, as shown in the top view of FIG. 9a. Shielding frame 242 is disposed between electrical components 136a-136b and electrical components 136c. Encapsulant 140 is deposited around conductive pillars 130 and electrical components 136a-136c, similar to FIGS. 2d-2f. Continuing from FIG. 3a, a shielding frame 244 is disposed around conductive pillars 160 and electrical components 166a-166d, as shown in FIG. 9b. Shielding frame 246 is disposed between electrical components 166a-166b and electrical components 166c-166d. Encapsulant 170 is deposited around conductive pillars 160 and electrical components 166a-166d, similar to FIGS. 3b-3c.

Shielding frames 240-246 can be one or more layers of Al, Cu, Sn, Ni, Au, Ag, or other suitable conductive material. Alternatively, shielding frames 240-246 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding frames 240-246 are grounded through RDL 190, conductive pillars 130, and interconnect substrate 120.

Figure 9C:
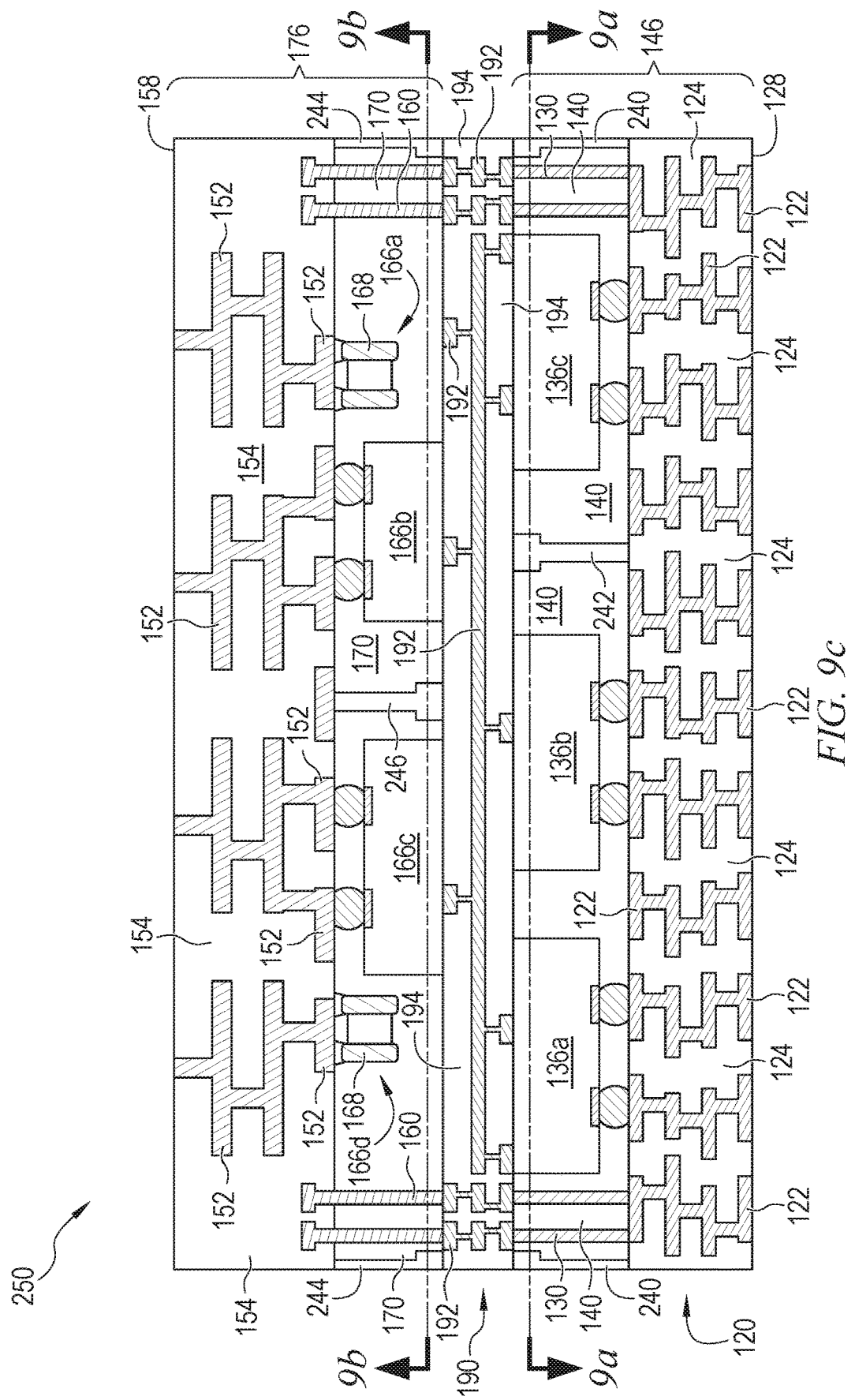

FIG. 9c shows a cross-sectional view of shielding frames 240-246 providing EMI isolation for electrical components 136a-136c and 166a-166d. MiP 250 contains semiconductor packages 146 and 176 bonded to RDL 190 with shielding frames 240-246.

Figure 10:
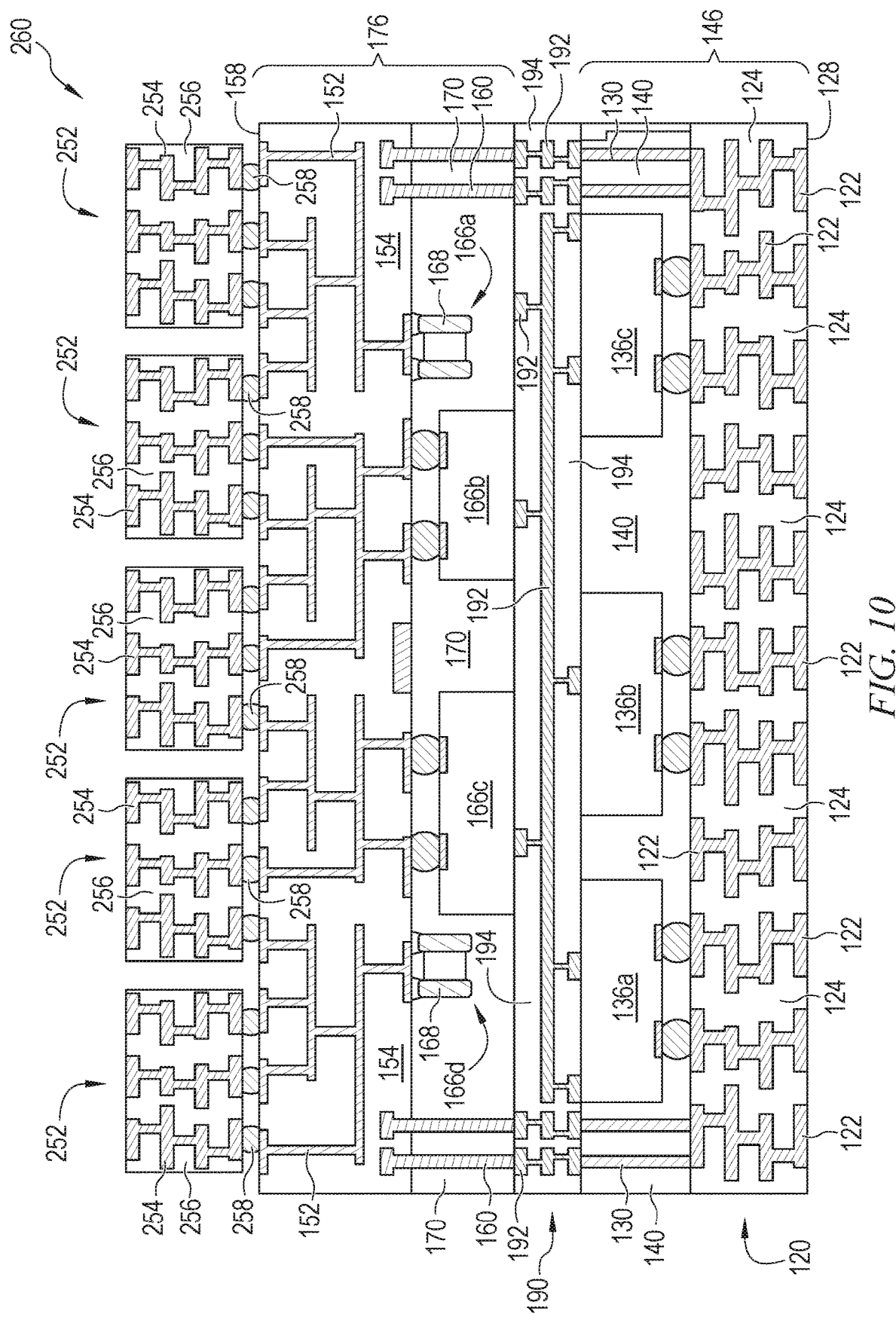
FIG. 10 illustrates the MiP with antenna disposed over the packages.

In another embodiment, continuing from FIG. 5d, embedded antenna-on-package (eAoP) 252 are disposed on surface 158 of substrate 150, as shown in FIG. 10. Each eAoP 252 contains one or more conductive layer 254 separated by insulating layers 256. At least one conductive layer 254 operates as an antenna with other conductive layers 254 providing electrical interconnect to the antenna. eAoP 252 is mechanically and electrically connected to conductive layer 152 in substrate 150 with bumps 258. Electrical components 136a-136c and 166a-166d can access eAoP 252 through substrate 120, conductive pillars 130, RDL 190, conductive pillars 160, substrate 150, and bumps 258. MiP 260 contains semiconductor packages 146 and 176 bonded to RDL 190 with eAoP 252.

Figure 11:
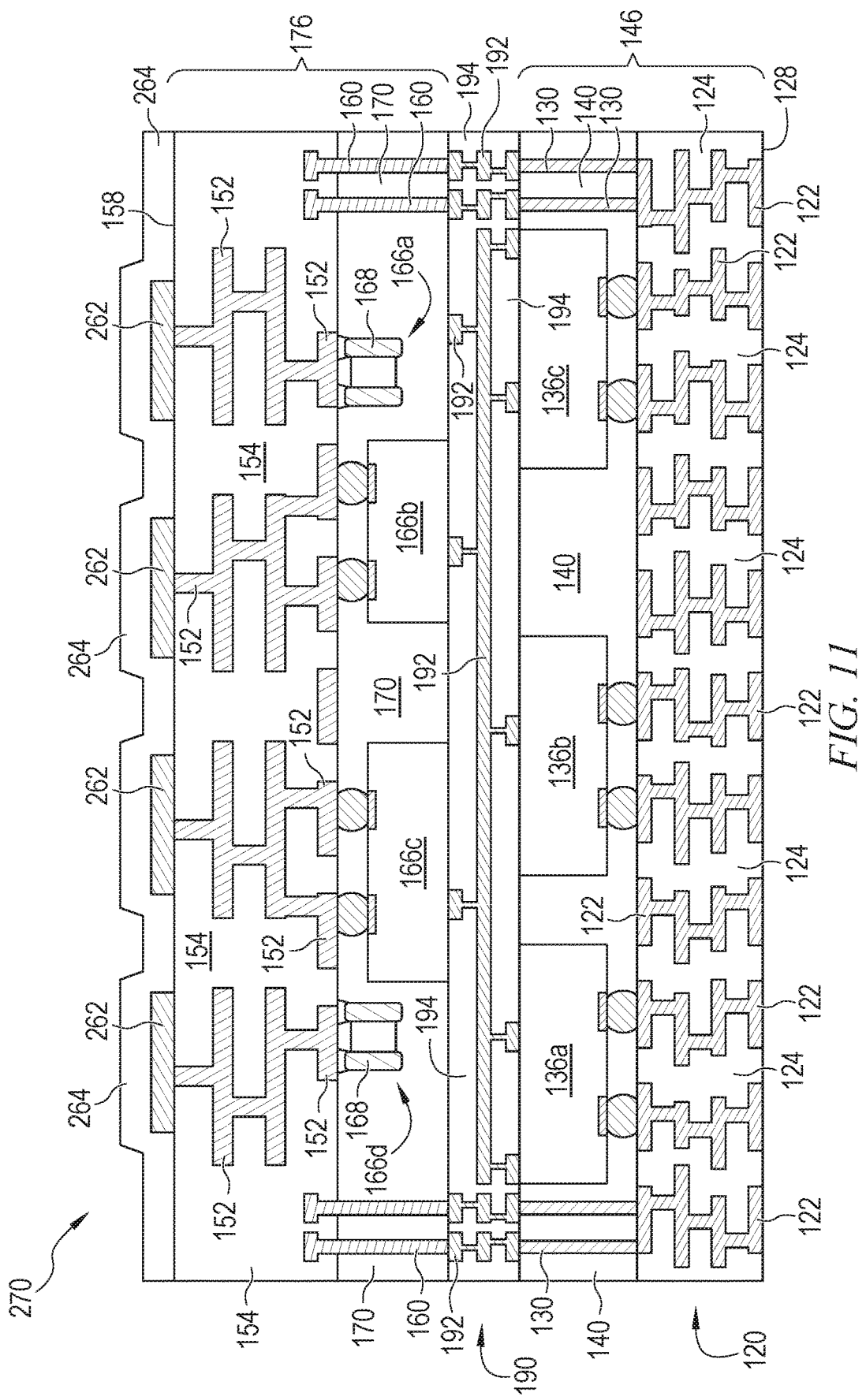
FIG. 11 illustrates the MiP with an alternate antenna disposed over the packages.

In another embodiment, continuing from FIG. 5d, one or more patch antenna 262 are disposed on surface 158 of substrate 150 and covered by encapsulant 264, as shown in FIG. 11. Electrical components 136a-136c and 166a-166d can access patch antenna 262 through substrate 120, conductive pillars 130, RDL 190, conductive pillars 160, and substrate 150. MiP 270 contains semiconductor packages 146 and 176 bonded to RDL 190 with patch antenna 262 covered by encapsulant 264.

Figure 12:
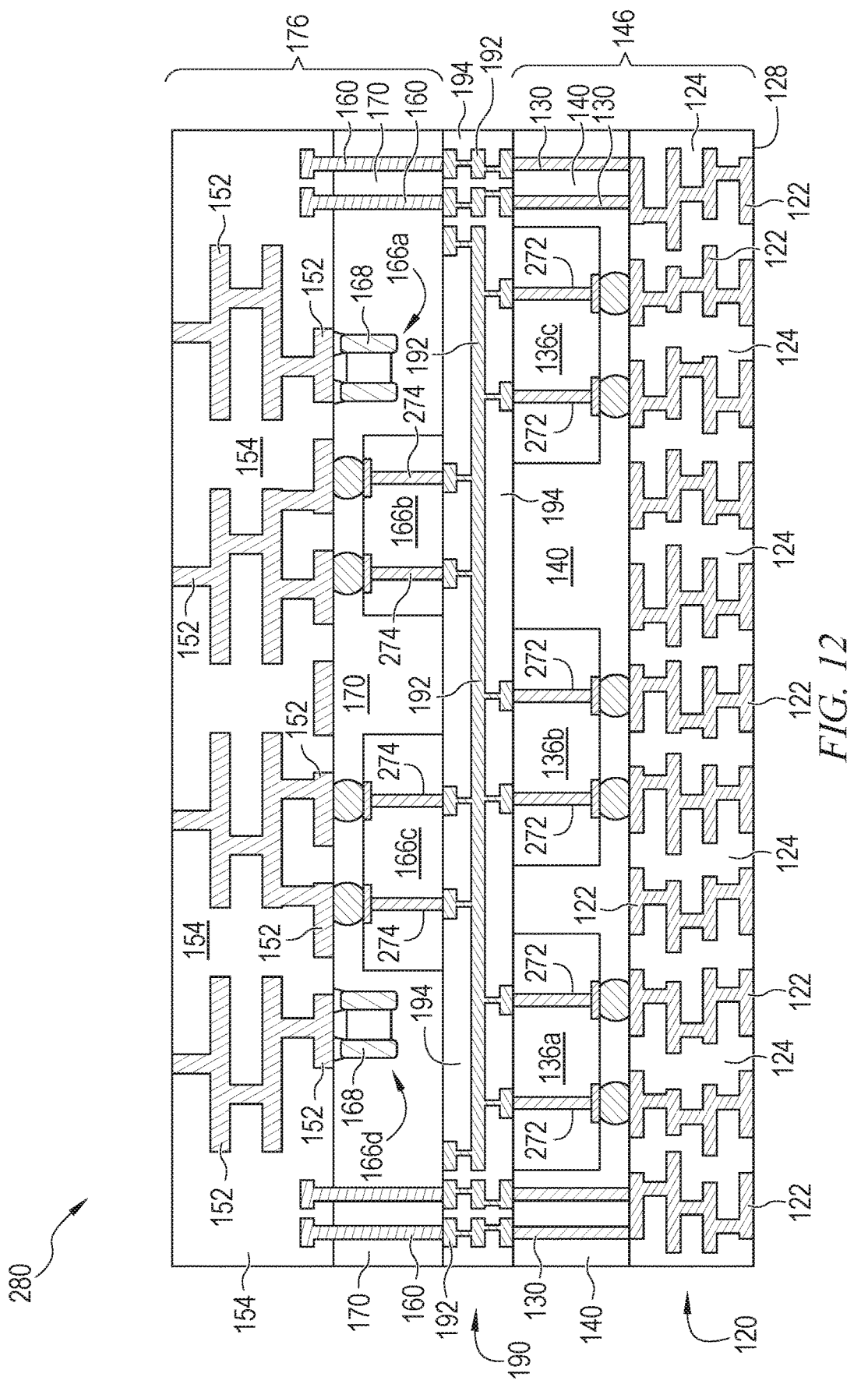
FIG. 12 illustrates the MiP with conductive vias formed through the electrical components.

In another embodiment, continuing from FIGS. 2c and 3a, a plurality of conductive vias 272 is formed through electrical components 136a-136c, and a plurality of conductive vias 274 is formed through electrical components 166b-166c, as shown in FIG. 12. Conductive vias 272 and 274 are electrically connected to interconnect substrate 120, RDL 190, and substrate 150. MiP 280 contains semiconductor packages 146 and 176 bonded to RDL 190 with conductive vias 272 formed through electrical components 136a-136c and conductive vias 274 formed through electrical components 166b-166c.

MiP 220, 230, 250, 260, 270, 280 provide the function of multiple packages in one module by disposing two different packages 146 and 176 on opposite surfaces of RDL 190. Advanced and complex technologies, such as 5G and hybrid modules, can be achieved in one package. In fact, MiP 220-280 can achieve many different electrical functions in one module. RDL 190 provides a short and efficient electrical interconnect between semiconductor packages 146 and 176. MiP 220-280 provide more electrical functionality in a smaller space, and less propagation delay and transmission loss through RDL 190.

Figure 13:
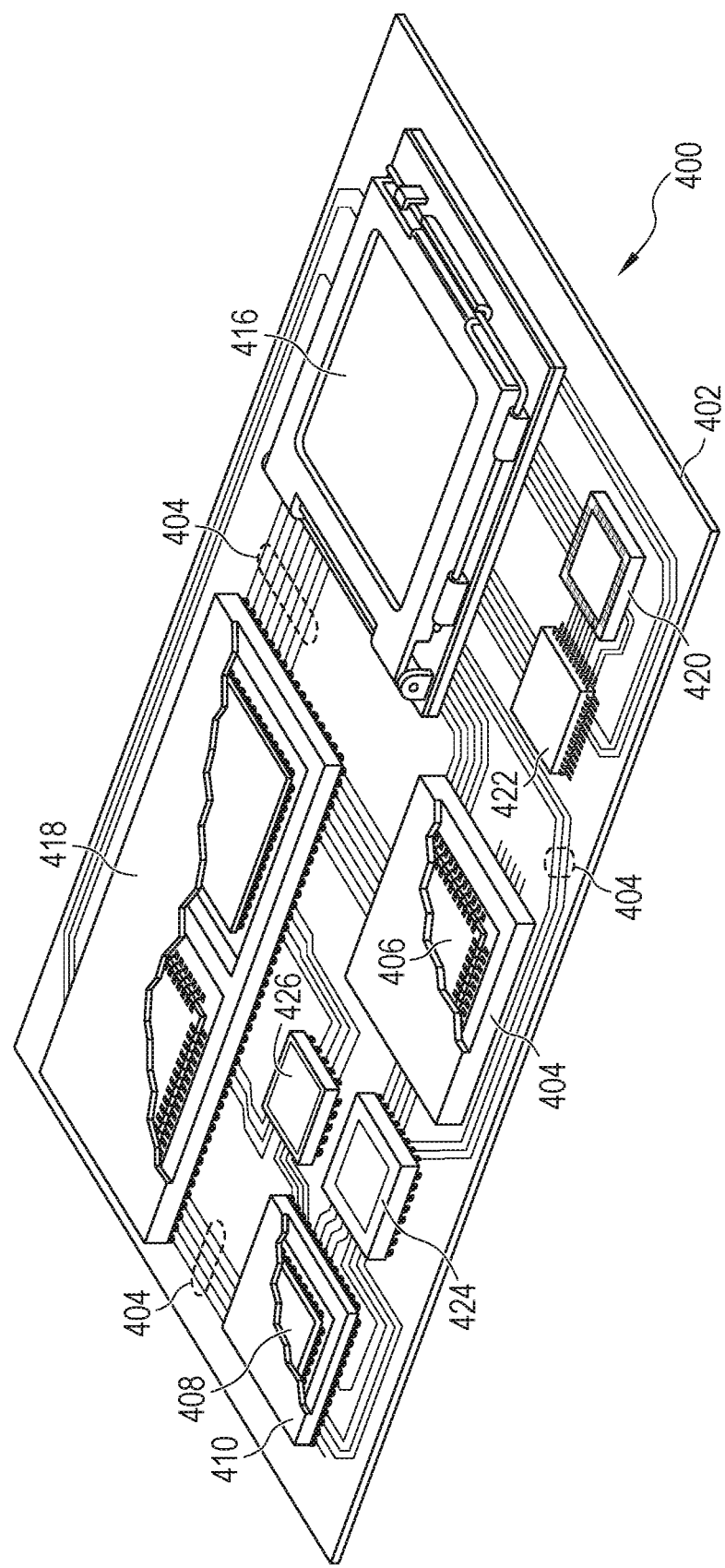
FIG. 13 illustrates a printed circuit board (PCB) with different types of packages disposed on a surface of the PCB.

FIG. 13 illustrates electrical device 400 having a chip carrier substrate or PCB 402 with a plurality of semiconductor packages disposed on a surface of PCB 402, including MiP 220, 230, 250, 260, 270, and 280. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 13, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   providing a first semiconductor package as a first formed package including,
   (a) providing a first substrate,
   (b) disposing a first electric component over the first substrate, and
   (c) depositing a first encapsulant over the first substrate and first electrical component with a surface of the first encapsulant planarized with a non-active surface of the first electrical component;

providing a second semiconductor package as a second formed package including,
(a) providing a second substrate,
(b) disposing a second electrical component over the second substrate, and
(c) depositing a second encapsulant over the second substrate and second electrical component with a surface of the second encapsulant planarized with a non-active surface of the second electrical component;

providing a redistribution layer (RDL);

disposing the first semiconductor package as the first formed package over a first surface of the RDL with the non-active surface of the first electric component in contact with a conductive layer of the RDL;

disposing the second semiconductor package as the second formed package over a second surface of the RDL opposite the first surface of the RDL with the non-active surface of the second electric component in contact with the RDL;

disposing the second surface of the RDL over the carrier; and removing the carrier after disposing the first semiconductor package over the first surface of the RDL.

2. The method of claim 1, wherein providing the first semiconductor package as the first formed package further includes:
   forming a plurality of conductive pillars over the first substrate; and
   depositing the first encapsulant around the conductive pillars and the first electrical component.

3. The method of claim 2, further including disposing a shielding frame around the first electrical component.

4. The method of claim 2, further including removing a portion of the first encapsulant to planarize a surface of the first encapsulant and expose the conductive pillars.

5. The method of claim 1, further including disposing an antenna over the first semiconductor package.

6. A method of making a semiconductor device, comprising:
   providing a carrier;
   bonding a first semiconductor package or component as a first formed package or component to a first surface of a redistribution layer (RDL) with a non-active surface of the first semiconductor package or component in contact with a conductive layer of the RDL;
   bonding a second semiconductor package or component as a second formed package or component to a second surface of the RDL opposite the first surface of the RDL with a non-active surface of the second semiconductor package or component in contact with the RDL;
   disposing the second surface of the RDL over the carrier; and
   removing the carrier after disposing the first semiconductor package or component over the first surface of the RDL.

7. The method of claim 6, wherein the first semiconductor package or component as the first formed package or component includes:
   providing a substrate;
   forming a plurality of conductive pillars over the substrate;
   disposing an electrical component over the substrate with a surface of the electrical component in contact with the RDL; and
   depositing an encapsulant around the conductive pillars and electrical component.

8. The method of claim 7, further including disposing a shielding frame around the electrical component.

9. The method of claim 7, further including removing a portion of the encapsulant to planarize a surface of the encapsulant and expose the conductive pillars.

10. The method of claim 7, further including forming a plurality of conductive vias through the electrical component.

11. The method of claim 6, further including disposing an antenna over the first semiconductor package or component.

12. The method of claim 6, wherein providing the first semiconductor package as a first formed package includes,
   providing a first substrate;
   disposing a first electric component over the first substrate; and
   depositing a first encapsulant over the first substrate and first electrical component with a surface of the first encapsulant planarized with a non-active surface of the first electrical component;
   and providing the second semiconductor package as a second formed package includes,
   providing a second substrate;
   disposing a second electric component over the second substrate; and
   depositing a second encapsulant over the second substrate and second electrical component with a surface of the second encapsulant planarized with a non-active surface of the second electrical component.

13. A semiconductor device, comprising:
   a carrier;
   a first formed semiconductor package or component;
   a second formed semiconductor package or component; and
   a redistribution layer (RDL), wherein the first formed semiconductor package or component is disposed over a first surface of the RDL with a non-active surface of the first semiconductor package or component in contact with a conductive layer of the RDL, and the second formed semiconductor package or component is disposed over a second surface of the RDL opposite the first surface of the RDL with a non-active surface of the second semiconductor package or component in contact with the RDL, and the second surface of the RDL is disposed over the carrier.

14. The semiconductor device of claim 13, wherein the first formed semiconductor package or component includes:
   a substrate;
   a plurality of conductive pillars formed over the substrate;
   an electrical component disposed over the substrate with a surface of the electrical component in contact with the RDL; and
   an encapsulant deposited around the conductive pillars and electrical component.

15. The semiconductor device of claim 14, further including a shielding frame disposed around the electrical component.

16. The semiconductor device of claim 14, wherein a surface of the encapsulant is planarized to expose the conductive pillars.

17. The semiconductor device of claim 13, further including an antenna disposed over the first formed semiconductor package or component.

18. The semiconductor device of claim 13, wherein the first formed semiconductor package or component includes,
   a first substrate;
   a first electric component disposed over the first substrate; and a first encapsulant deposited over the first substrate and first electrical component with a surface of the first encapsulant planarized with a non-active surface of the first electrical component;

and the second formed semiconductor package or component includes, a second substrate;

a second electric component disposed over the second substrate, and a second encapsulant deposited over the second substrate and second electrical component with a surface of the second encapsulant planarized with a non-active surface of the second electrical component.

\* \* \* \* \*